(12) United States Patent
Kimura et al.

(10) Patent No.: US 10,715,053 B2
(45) Date of Patent: Jul. 14, 2020

(54) POWER CONVERSION APPARATUS IN WHICH AN INDUCTANCE OF A LAST OFF CLOSED CIRCUIT IS SMALLER THAN AN INDUCTANCE OF A NON-LAST OFF CLOSED CIRCUIT

(71) Applicant: DENSO CORPORATION, Kariya, Aichi-pref. (JP)

(72) Inventors: Mitsunori Kimura, Kariya (JP); Kengo Mochiki, Kariya (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 15/923,340

(22) Filed: Mar. 16, 2018

(65) Prior Publication Data
US 2018/0269799 A1 Sep. 20, 2018

(30) Foreign Application Priority Data

Mar. 20, 2017 (JP) .................................. 2017-053835

(51) Int. Cl.
| | |
|---|---|
| *H02M 7/5387* | (2007.01) |
| *H03K 17/12* | (2006.01) |
| *H02M 7/493* | (2007.01) |
| *H02M 7/00* | (2006.01) |
| *H02M 1/08* | (2006.01) |
| *H02M 1/00* | (2006.01) |

(52) U.S. Cl.
CPC .......... *H02M 7/5387* (2013.01); *H02M 1/08* (2013.01); *H02M 7/003* (2013.01); *H02M 7/493* (2013.01); *H03K 17/12* (2013.01); *H02M 2001/0054* (2013.01); *H03K 2217/0036* (2013.01); *Y02B 70/1491* (2013.01)

(58) Field of Classification Search
CPC ............ Y02B 70/1491; Y02B 70/1425; Y02B 70/1441; H01L 23/46; H01L 23/473; H01L 29/1608; H03K 17/12; H03K 2217/0036; H02M 7/003; H02M 7/537; H02M 1/12; H02M 1/088; H02M 7/797; H02M 2001/0048; H02M 2001/0054; H02M 2001/0051; H02M 7/44; H02M 7/48; H02M 1/08; H02M 7/493; H02M 7/5387

See application file for complete search history.

(56) References Cited

U.S. PATENT DOCUMENTS

| | | | |
|---|---|---|---|
| 9,673,730 B2 | 6/2017 | Zhang et al. | |
| 9,793,791 B2 * | 10/2017 | Shono ..................... | H02M 1/36 |
| 9,935,551 B2 * | 4/2018 | Kataoka .................. | H02M 1/08 |

(Continued)

*Primary Examiner* — Gustavo A Rosario-Benitez
(74) *Attorney, Agent, or Firm* — Oliff PLC

(57) ABSTRACT

A power conversion apparatus is provided in which an upper arm semiconductor device, a lower arm semiconductor device and a capacitor. At least either upper arm semiconductor device or lower arm semiconductor device constitutes a parallel-connected body. In an opposite arm against the parallel-connected body, a permissible element is provided. In the switching elements that constitute the parallel-connected body, a last off element and a non-last off circuit are identified. Inductance of a last off closed circuit where current flows through the last off element, reflux element in the opposite arm and the capacitor is smaller than inductance of a non-last off closed circuit where current flows through the last off element, reflux element in the opposite arm and the capacitor.

13 Claims, 23 Drawing Sheets

(56) References Cited

U.S. PATENT DOCUMENTS

| | | | |
|---|---|---|---|
| 10,447,259 B2* | 10/2019 | Kamiya | H02M 7/53875 |
| 2010/0171473 A1 | 7/2010 | Kazama | |
| 2012/0057387 A1* | 3/2012 | Lai | H02M 7/797 |
| | | | 363/132 |
| 2013/0062626 A1* | 3/2013 | Takao | H03K 17/127 |
| | | | 257/77 |
| 2013/0155745 A1 | 6/2013 | Tanaka et al. | |
| 2014/0184303 A1* | 7/2014 | Hasegawa | H03K 17/12 |
| | | | 327/377 |
| 2016/0301308 A1 | 10/2016 | Amar et al. | |

\* cited by examiner

POWER CONVERSION APPARATUS IN WHICH AN INDUCTANCE OF A LAST OFF CLOSED CIRCUIT IS SMALLER THAN AN INDUCTANCE OF A NON-LAST OFF CLOSED CIRCUIT

CROSS-REFERENCE TO RELATED APPLICATION

This application is based on and claims the benefit of priority from earlier Japanese Patent Application No. 2017-53835 filed Mar. 20, 2017, the description of which is incorporated herein by reference.

BACKGROUND

Technical Field

The present disclosure relates to a power conversion apparatus, and more particularly to a power conversion apparatus configured of upper arm semiconductor devices and lower arm semiconductor devices which are mutually connected in series between a high-potential line and a low-potential line.

Description of the Related Art

A power conversion apparatus is known in which upper semiconductor devices and lower arm semiconductor devices are mutually connected in series between a high-potential line and a low-potential line. For example, Japanese patent literature, e.g., Japanese patent number 5805513 discloses a power conversion apparatus in which each of the upper arm semiconductor devices and each of the lower arm semiconductor devices are configured of two switching elements connected in parallel (hereinafter referred to as a parallel-connected body). Specifically, the above-mentioned patent literature discloses a configuration in which two switching elements included in the parallel-connected body are controlled to be turned off at mutually different turn off timing.

However, according to the above-described patent literature, a technique of effectively reducing a switching loss is not suggested in the control of shifting the turn off timing for the two switching elements. Specifically, a switching element that subsequently turns off in the parallel connected two switching elements causes a current change in the main circuit, thus causing a switching loss. Accordingly, when the inductance of the closed circuit is large where the current change occurs, the switching loss cannot be reduced efficiently.

SUMMARY

The present disclosure is achieved in light of the above-described circumstances and provides a power conversion apparatus capable of effectively reducing a switching loss thereof.

A first aspect of the present disclosure is a power conversion apparatus including: a high potential line and a low potential line; an upper arm semiconductor device connected to the high potential line; a lower arm semiconductor device serially connected to the upper arm semiconductor device and connected to the low potential line; and a capacitor connected between the high potential line and the low potential line, in which at least one of the upper arm semiconductor device and the lower arm semiconductor device which are serially connected to each other constitute a parallel-connected body configured of two or more switching elements connected in parallel; a reflux element is provided at least in an opposite arm opposite to an arm configured of the parallel-connected body among the upper arm semiconductor device and the lower arm semiconductor device, the reflux element allowing current to flow towards a high-potential line side from a low potential line side; the switching elements that constitute the parallel-connected body are controlled such that turn-off timings are different from each other; a last off element that turns off last and a non-last off element as the other element are identified among the switching elements that constitute the parallel-connected body; inductance of a last off closed circuit where current passes through the last off element, the reflux element in an opposite arm opposite to the last off element and the capacitor is smaller than inductance of a non-last off closed circuit where current passes through the non-last off element connected in parallel to the last off element, the reflux element in an opposite arm opposite to the last off element and the capacitor.

According to the above-described power conversion apparatus, inductance of the above-mentioned last off closed circuit is smaller than inductance of the above-mentioned non-last off closed circuit. Thus, switching loss can be effectively reduced. In other words, in the circuit configuration of the above-described power conversion apparatus, when the last off element turns off, reflux current starts to flow through the reflux element in an opposite arm which is opposite to an arm where the last off element is provided. At this time, current changes in the above-described last off closed circuit. By reducing a surge voltage due to the current change in the last off closed circuit, the switching loss can be reduced. In this respect, in the above-described power conversion apparatus, the inductance of the last off closed circuit is set to be smaller than the inductance of the non-last off closed circuit. Accordingly, switching loss can be effectively reduced.

As described, according to the above-described aspect, a power conversion apparatus capable of effectively reducing the switching loss can be provided. It should be noted that the bracketed reference signs in this section and in the claims indicate correspondence to specific means in the embodiments as one aspect which will be described later, and do not limit the technical scope of the present disclosure.

DETAILED DESCRIPTION OF PREFERRED EMBODIMENTS

First Embodiment

With reference to FIGS. 1 to 4, embodiments of a power conversion apparatus will be described.

Figure 1:
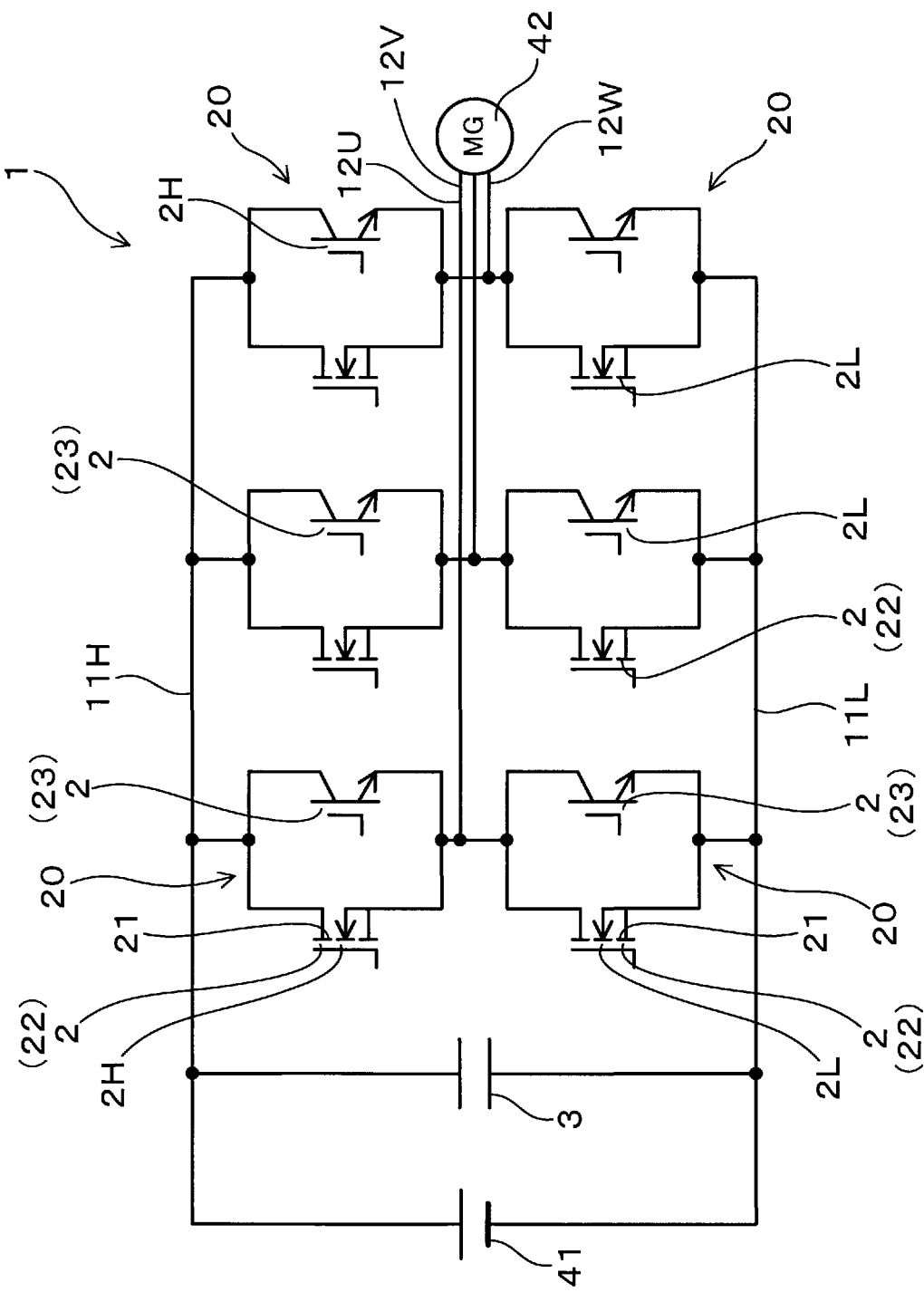
FIG. 1 is a circuit diagram showing a power conversion apparatus according to a first embodiment of the present disclosure.

As shown in FIG. 1, a power conversion apparatus 1 according to the first embodiment is provided with a high-potential line 11H, a low-potential line 11L, an upper arm semiconductor device 2H connected to the high-potential line 11H, a lower arm semiconductor device 2L and a capacitor 3. The lower arm semiconductor device 2L is serially-connected to the upper arm semiconductor device 2H. The capacitor 3 is connected between the high-potential line 11H and the low-potential line 11L.

At least either the upper arm semiconductor device 2H or the lower arm semiconductor device 2L which are mutually connected in series constitutes a parallel-connected body 20 provided with two or more switching elements connected in parallel. In the serially connected upper arm semiconductor device 2H and the lower arm switching semiconductor device 2L, a reflux element 21 is provided at least in an opposite side arm opposite to the parallel-connected body 20 to allow current to flow towards the high-potential line 11H from the low-potential line 11L.

Figure 4:
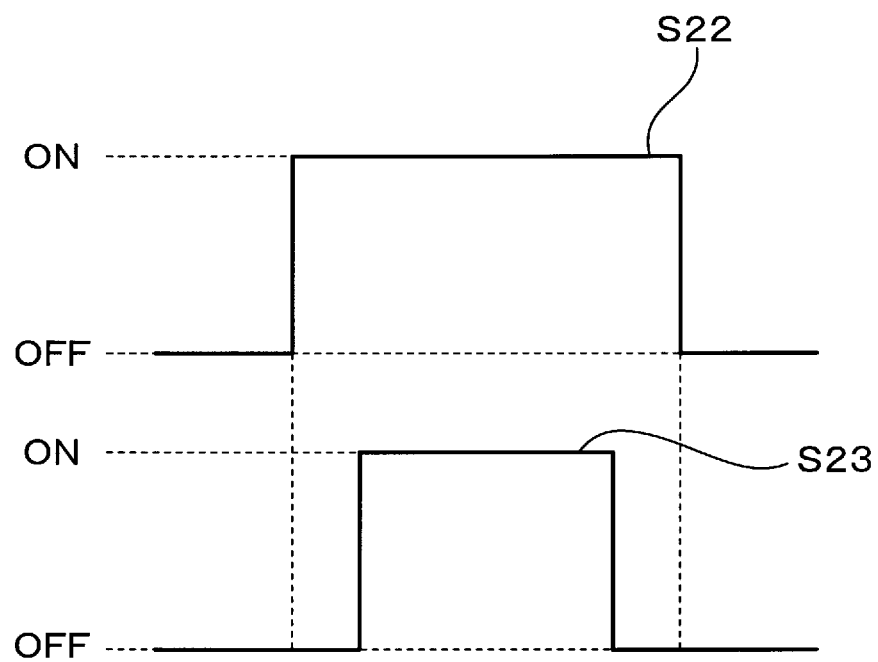
FIG. 4 is a timing diagram showing switching operations of a last off element and a non-last off element according to the first embodiment.

As shown in FIG. 4, the plurality of switching elements 2 that constitute the parallel-connected body 20 is controlled such that turn-off timings are to be different from each other. Among the switching elements 2 that constitute the parallel-connected body 20, a last off element 22 and a non-last off element 23 are identified. The last off element 22 turns off last and the non-last off element 23 is the other switching element 2. In other words, in the plurality of switching elements 2 of the parallel-connected body 20, turn-off timings are controlled for the switching elements such that a specific switching element 2 is controlled to be turned off last. Then, the specific switching element 2 is determined as the last off element 22 and the other switching element 2 is determined as non-last off element 23.

Figure 2:
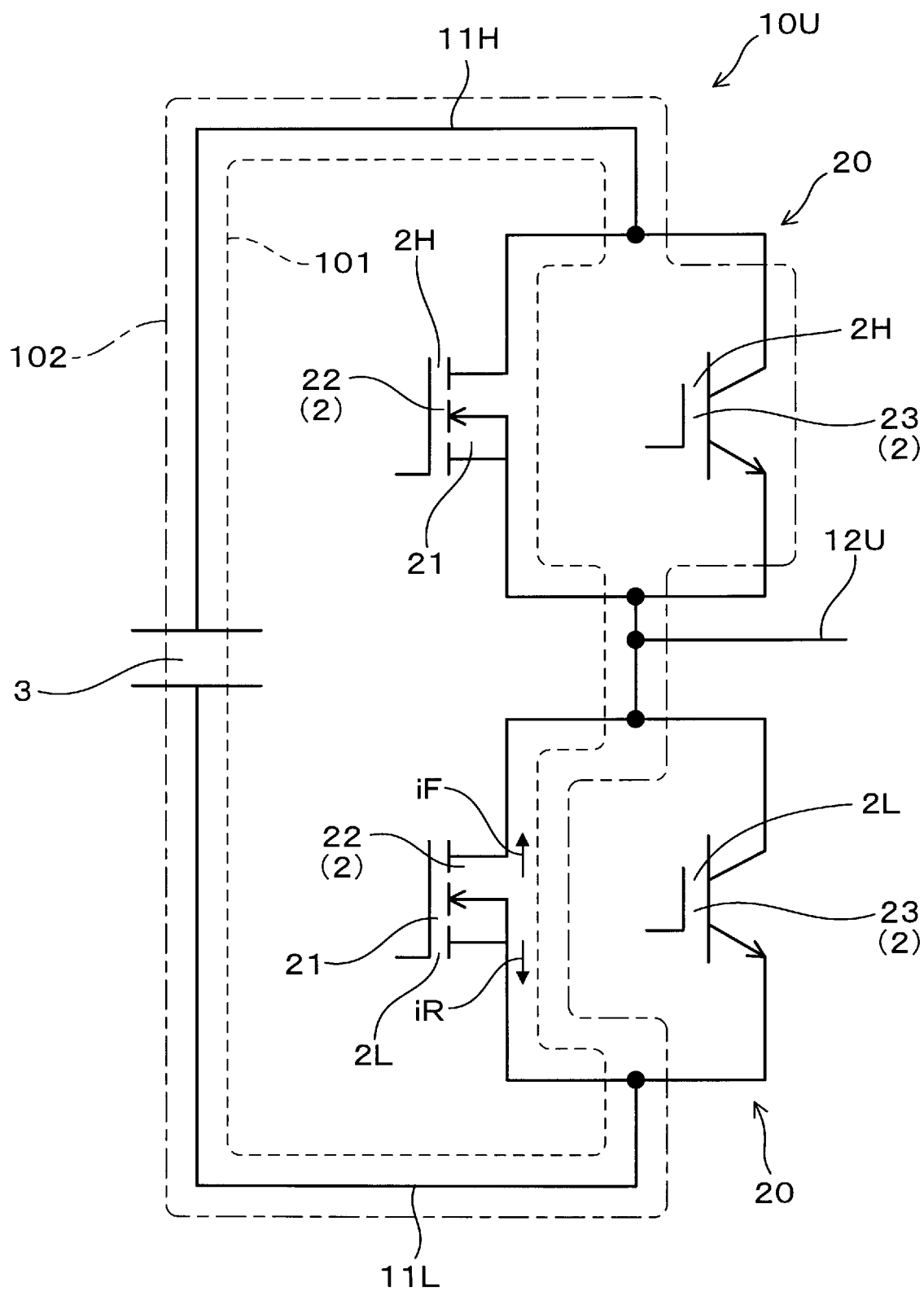
FIG. 2 is an explanatory diagram showing a last off closed circuit and a non-last off closed circuit when considering switching operation of an upper arm semiconductor device according to the first embodiment.
Figure 3:
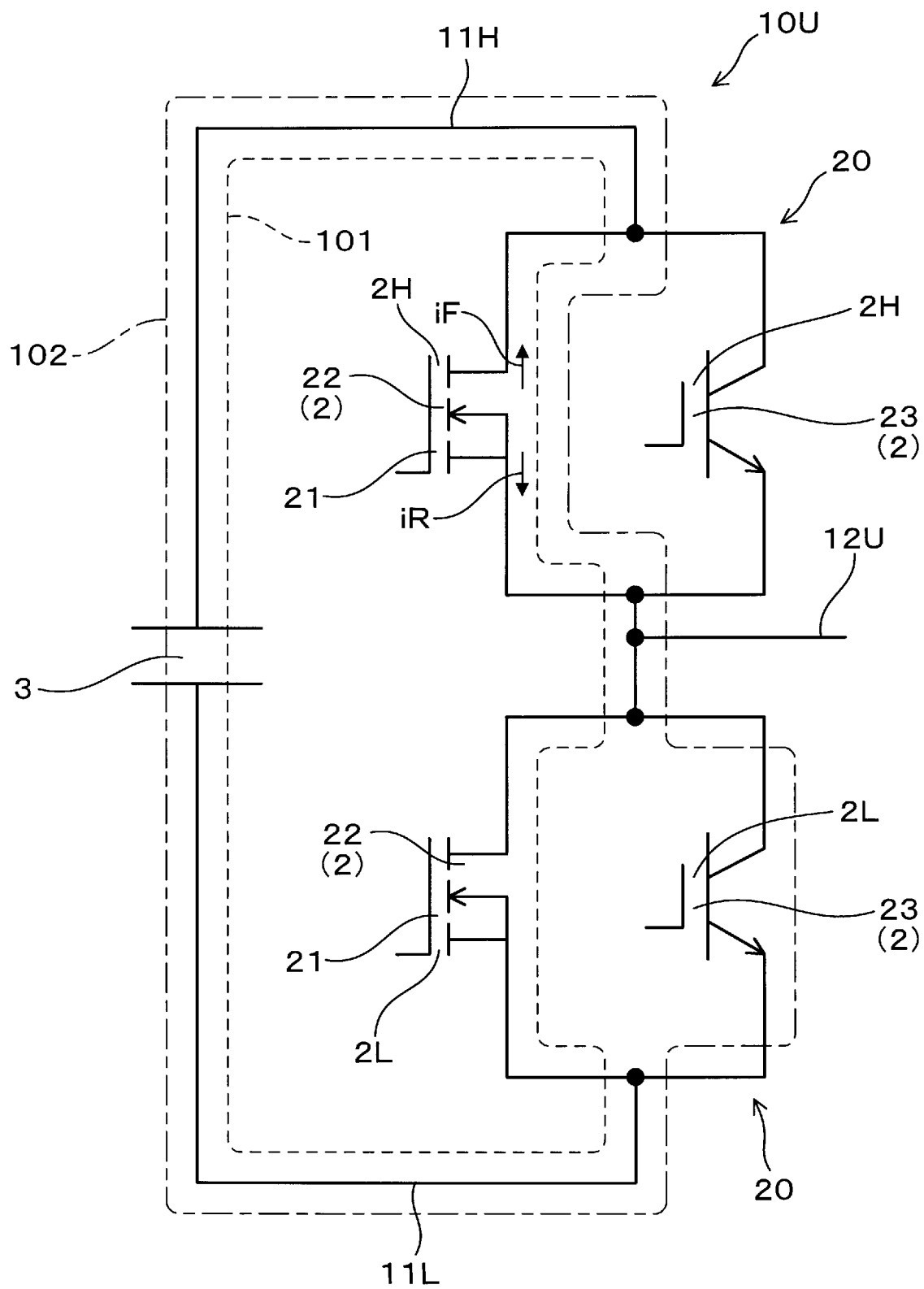
FIG. 3 is an explanatory diagram showing a last off closed circuit and a non-last off closed circuit when considering switching operation of a lower arm semiconductor device according to the first embodiment.

As shown in FIGS. 2 and 3, the last off closed circuit 101 is determined as a closed circuit where current passes through the last off element 22, the reflux element 21 included in the opposite arm which is opposite to the last off element 22, and the capacitor 3. The non-last off closed circuit 102 is determined as a closed circuit path where current passes through the non-last off element 23 parallelly connected to the last off element 22, the reflux element 21 included in the opposite side arm which is opposite to the last off element 22 and the capacitor 3. At this time, the inductance of the last off closed circuit 101 is smaller than the inductance of the non-last off closed circuit 102.

As shown in FIG. 1, in the power conversion apparatus 1 according to the first embodiment, each of the upper arm semiconductor device 2H and the lower arm semiconductor device 2L constitutes the parallel-connected body. Also, each parallel-connected body 20 is configured of two switching elements connected in parallel. These two switching elements 2 are configured of mutually different types of semiconductor devices. Specifically, the switching elements 2 that constitute the parallel-connected body 20 are composed of SiC-MOSFET (i.e., metal oxide semiconductor field effect transistor made of silicon carbide) and Si-IGBT (i.e., insulated gate bipolar transistor made of silicon).

As shown in FIG. 1, three legs are provided, in which each leg is configured of a parallel-connected body 20 composed of the upper arm semiconductor device 2H and a parallel-connected body 20 composed of the lower arm semiconductor device 2L which are serially-connected. Also, the capacitor 3 and the three legs are connected in parallel between the high-potential line 11H and the low-potential line 11L. Each of the legs has the same configuration. Specifically, the three legs are connected to respective phase electrodes of three-phase AC (alternating current) rotary electric machine 42, between the upper arm semiconductor device 2H and the lower arm semiconductor 2L, that is, U-phase electrode, V-phase electrode, and W-phase electrode via the output wirings 12U, 12V and 12W. Note that the high-potential line 11H is connected to the positive electrode of the DC (direct current) power source 41 and the low-potential line 11L is connected to the negative electrode of the DC power source 41. Thus, the power conversion apparatus 1 is configured to convert DC power from the DC power source 41 to be three-phase AC power by turning the switching element 2 to be ON and OFF, thereby driving the rotary electric machine 42. Also, the power conversion apparatus 1 is configured such that the AC power generated by the rotary electric machine 42 is converted to DC power as regenerative power.

According to the present embodiment, the last off element 22 is configured of a MOSFET and the non-last off element 23 is configured of an IGBT. Also, the MOSFET includes a parasitic diode which serves as the reflux element 21 that allows current to flow towards the high-potential line 11H side from the low-potential line 11L side. Further, the MOSFET can serve as the reflux element 21 by performing synchronous rectification in which the MOSFET is turned ON during reflux operation. In either case, according to the present embodiment, one MOSFET serves as both of the last off element 22 and the reflux element 21.

As described, in the power conversion apparatus 1, the respective switching elements 2 are controlled to be ON and OFF at a predetermined timing. The plurality of switching elements 2 that constitute respective parallel-connected body 20 turn ON and OFF approximately synchronizing to each other. In other words, each arm is configured of the parallel-connected body 20 of the plurality of switching elements 2 so that the resistance can be lowered in the respective arms, thereby reducing the switching loss. As shown in FIG. 4, in each parallel-connected body 20, turn off timings between two switching elements 2 are shifted from each other. Specifically, the last off element 22 turns off after the non-last off element 23 turns off. In FIG. 4, the solid line S22 shows on-off timing of the last off element 22 and the solid line S23 shows on-off timing of the non-last element 23.

According to the present embodiment, the plurality of switching elements 2 that constitute the parallel-connected body 20 are further controlled such that the turn on timings thereof are shifted from each other. Then, the last off element 22 in the plurality of switching elements 2 that constitute the parallel-connected body 20 is controlled to turn on first. According to the present embodiment, as shown in FIG. 4 (S22), the last off element 22 first turns on and turns off the last.

Therefore, immediately after turning the last element 22 on and immediately before turning the last element 22 off, current only flows through the last off element 22 in the switching elements 2 of the parallel-connected body 20. Therefore, when the last off element 22 turns on and turns off, current change occurs at the last off element 22, causing a recovery current or reflux current to flow through the last off element 22 and the reflux element 21 in the opposite arm.

In this respect, a closed circuit 10U in the power conversion circuit will be used for the explanation. The closed circuit 10U is configured of a leg connected to the U-phase output wiring 12U, the high-potential line 11H, and the low-potential line 11L and the capacitor 3. The closed circuit 10U is shown in FIGS. 2 and 3. Note that a phenomenon similar to the above-described closed circuit 10U will occur in a closed-circuit configured of a leg connected to the V-phase output wiring 12V, the high-potential line 11H, the low-potential line 11L and the capacitor 3. Likewise, a similar phenomenon will occur in the closed circuit configured of a leg connected to the W-phase output wiring 12W, the high-potential line 11H, the low-potential line 11L and the capacitor 3.

For example, when turning the last off element 22 of the upper arm semiconductor device off, reflux current iF start to flow through the reflux element 21 (parasitic diode in the MOSFET according to the present embodiment) of the lower arm, to return the energy stored in the inductance of the rotary electric machine 42 to the power source 41. At this time, as shown in FIG. 2, in the closed circuit 10U, a current change occurs in a closed circuit that connects the reflux element 21 of the lower arm semiconductor 2L, the last off element 22 of the upper arm semiconductor 2H, the high potential line 11H, the capacitor 3 and the low-potential line 11L. Hence, by reducing the inductance of the last off closed circuit 101, surge voltage due to turn off operation can be reduced. Also, by reducing the inductance of the last off closed circuit 101, switching speed can be higher so that the switching loss due to turn off operation can be reduced as well.

When turning the last off element 22 of the upper arm semiconductor device 2H on, reverse bias is applied to the reflux element 21 of the lower arm semiconductor device 2L through which current has been flowing towards the high-potential line 11H from the low-potential line 11L side. Thus, recovery current iR is momentarily produced at the reflux element 21 of the lower arm semiconductor device 2L, which flows towards the low-potential line 11L. As shown in FIG. 2, in the closed circuit 10U, the recovery current iR flows through a closed circuit that connects the reflux element 21 of the lower arm semiconductor device 2L (parasitic diode of MOSFET according to the present embodiment), the low-potential line 11L, the capacitor 3, the high potential line 11H and the last off element 22 of the upper arm semiconductor device 2H in this order. In other words, the above-described recovery current iR flows through the closed circuit which is the same as the above-described last off closed circuit 101 in a direction opposite to the reflux current iF. Then, surge voltage is produced in response to a decrease of the recovery current. Therefore, lowering the inductance of the last off closed circuit 101 is effective for reducing the surge voltage when being turned on.

Thus, according to the present embodiment, reducing the inductance of the last off closed circuit 101 is effective for lowering switching losses of the last off element 22 when being turned on and off. Meanwhile, inductance of the closed circuit 102 including the non-last off element 23, that is, inductance of a closed circuit passing through the reflux element 21 of the lower arm semiconductor device 2L (parasitic diode of MOSFET according to the present embodiment), the non-last off element 23 of the upper arm semiconductor device 2H, the high potential line 11H, the capacitor 3 and the low-potential line 11L seldom influence the switching loss.

In this respect, according to the present embodiment, the inductance of the last off closed circuit 101 is set to be lower than that of the non-last off closed circuit 102.

In the present embodiment, when focusing on the switching operation of the lower arm semiconductor device 2L, as shown in FIG. 3, the last off closed circuit 101 is defined as a closed loop circuit that includes the last off element 22 of the lower arm semiconductor device 2L, and the reflux element 21 (parasitic diode of MOSFET according to the present embodiment) of the upper arm semiconductor device 2H. The non-last off closed circuit 102 is defined as a closed loop circuit that includes the non-last off element 23 of the lower arm semiconductor device 2L, and the reflux element 21 (parasitic diode of MOSFET according to the present embodiment) of the upper arm semiconductor device 2H. Similarly, the relationship therebetween is defined such that the inductance of the last off closed circuit 101 is smaller than that of the non-last off closed circuit 102.

Note that the turn off timing of the switching element 2 is defined as a timing at which a controlled current (i.e., current between drain and source or current between collector and emitter according to the present embodiment) flowing through the switching element 2 is cutoff. The switching element 2 repeatedly turns on and off in response to the on-off signal transmitted from the control unit. However, the turn off timing of the switching element 2 does not match the timing at which the on-off signal turns off from the on state. In other words, the controlled current is cutoff when the on-off signal from the control unit turns off from the on state and the gate voltage of the switching element 2 starts to decrease to reach a predetermined threshold. This timing is referred to as turn off timing of the switching element 2.

On the other hand, the turn on timing of the switching element 2 is defined as a timing at which the controlled current (i.e., current between drain and source or current between collector and emitter according to the present embodiment) starts to flow through the switching element 2. Similarly, the turn on timing of the switching element 2 does not necessarily match the timing at which the on-off signal from the control unit turns on from the off state. Specifically, when the on-off signal turns on from the off state and the gate voltage applied to the switching element 2 starts to increase to reach a predetermined threshold, the controlled current starts to flow. This timing is referred to as turn on timing of the switching element 2.

Accordingly, timings of the off signal to the non-last off element 23 and the last off element 22 from the control unit can be set as the same timing, by setting the gate resistance of the non-last off element 23 to be smaller than that of the last off element 22. It is apparent that the off signal timing to the last off element 22 from the control unit may be delayed from the off signal to the non-last off element 23.

Next, effects and advantages of the present embodiment will be described. In the above-described power conversion apparatus 1, the inductance of the last off closed circuit 101 is set to be smaller than that of the non-last off closed circuit 102. Thus, switching loss can be effectively reduced.

In a circuit configuration of the above-described power conversion apparatus 1, reflux current iF starts to flow through a reflux element 21 in an opposite arm which is opposite to the last off element 22, when the last off element 22 turns off. Then, current change occurs at the last off closed circuit 101. The surge voltage caused by the reflux current iF that flows through the last off closed circuit 101 is reduced so that the switching loss can be reduced. In this respect, according to the power conversion apparatus 1, the inductance of the last off closed circuit 101 is set to be smaller than that of the non-last off closed circuit 102. Thus, switching loss can be effectively reduced.

Also, the last off element 22 is controlled to be firstly turned on among the plurality of switching elements 2 that constitute the parallel-connected body 20. Hence, the surge voltage when being turned on can be effectively reduced.

The plurality of switching elements 2 that constitute the parallel-connected body 20 is configured of SiC-MOSFET and Si-IGBT. Hence, two types of semiconductor elements are utilized for effectively reducing switching loss so that losses in arms can be reduced.

Specifically, according to the present embodiment, the last off element 22 is configured of a SiC-MOSFET. This is because the last off element 22 utilizes a SiC-MOSFET which can achieve fast switching speed (turn on-off time), thereby further reducing the switching loss. Meanwhile, in the Si-IGBT device, a tale current flows when turning off. Accordingly, a switching loss due to the tale current can be reduced when Si-IGBT is not used for the last off element 22. Also in this point of view, Si-IGBT is used for the non-last off element 23 and SiC-MOSFET is used for the last off element 22, whereby switching loss can be reduced more effectively.

As described, according to the present embodiment, a power conversion apparatus capable of effectively reducing switching loss can be provided.

Note that unlike the above-described first embodiment, the last off element can be configured of Si-IGBT and the non-last off element can be configured of SiC-MOSFET. In this case, SiC-MOSFET can be used as an auxiliary switching element 2. Hence, since relatively expensive SiC-MOSFET can readily be made small in size so that cost reduction of the power conversion apparatus can be accomplished. On the other hand, since the last off element is configured of Si-IGBT, switching loss is likely to be a problem. However, by using a configuration in which inductance of the last off closed circuit is set to be smaller than that of the non-last off closed circuit, switching loss can be smaller. That is, when the last off element is configured of Si-IGBT and the non-last off element is configured of SiC-MOSFET, whereby an increase of switching loss can be suppressed and also cost reduction can be achieved.

In the above-described first embodiment, two switching elements 2 are connected in parallel to compose the parallel-connected body. The parallel-connected body may be configured of three or more switching elements 2 which are connected in parallel. Also in this case, a switching element 2 which turns off last among there or more switching elements 2 is determined as the last off element and rest of two or more switching elements 2 are determined as non-last off elements. The turn off timings among two or more non-last off elements may be shifted from each other. In this case, inductance of the closed circuit path that passes through the non-last off element is preferably set such that the slower the turn off timing of the non-last off element, the smaller the inductance of the closed circuit.

Second Embodiment

Figure 5:
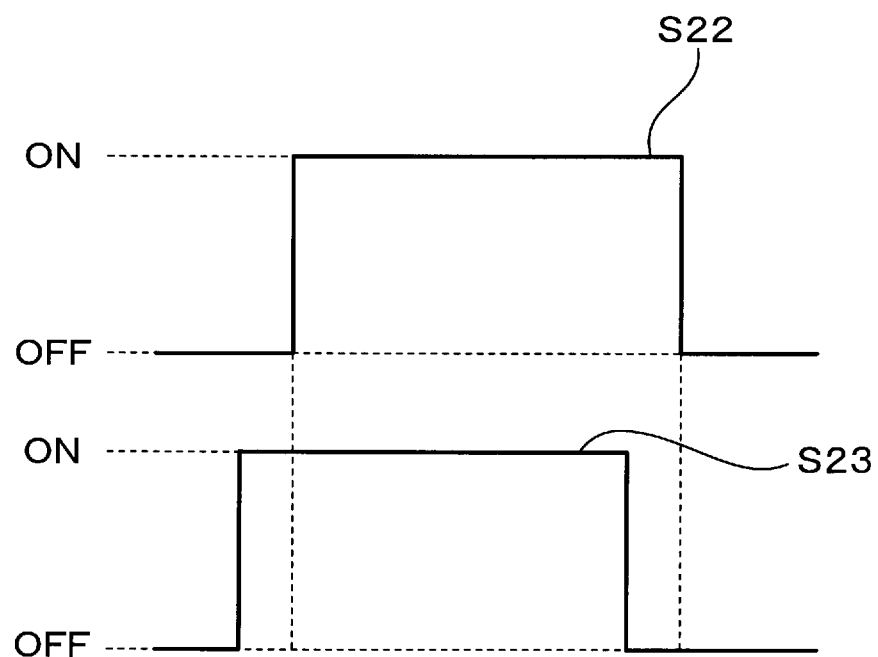
FIG. 5 is a timing diagram showing switching operations of the last off element and the non-last off element according to the second embodiment.

According to the second embodiment, as shown in FIG. 5, the turn off timing of the last off element 22 is controlled to be shifted to a timing earlier than the turn on timing of the non-last off element 23. Note that the turn off timing of the last off element 22 is the same as that of the first embodiment in which the turn off timing of the last off element 22 is set to be a timing later than the turn off timing of the non-last element 23. It should be noted that the same reference symbols as used in previous embodiments represent similar elements in the previous embodiments unless otherwise specified.

According to the present embodiment, switching loss when turned on is not reduced, however, switching loss when turned off can effectively be reduced similar to the first embodiment. For the switching loss, current change when turned off significantly influences the switching loss. Hence, assuming that the switching loss when turned off can be reduced, power loss of the power conversion apparatus 1 can effectively be reduced with the second embodiment as well.

A recovery current in the reflux element 21 when turning on can be suppressed by using a Schottky barrier diode or the like. In particular, with the use of a Schottky barrier diode made of SiC, sufficient breakdown voltage can be secured and recovery current can be better suppressed. In this case, similar to the present embodiment, without considering the switching loss when turning on, power loss in the power conversion apparatus 1 can be sufficiently reduced by setting the turn off timing and the inductance of the last off closed circuit 101.

Further, a control may be performed such that turn on timings of the last off element and the non-last off element are set to be the same.

Third Embodiment

Figure 6:
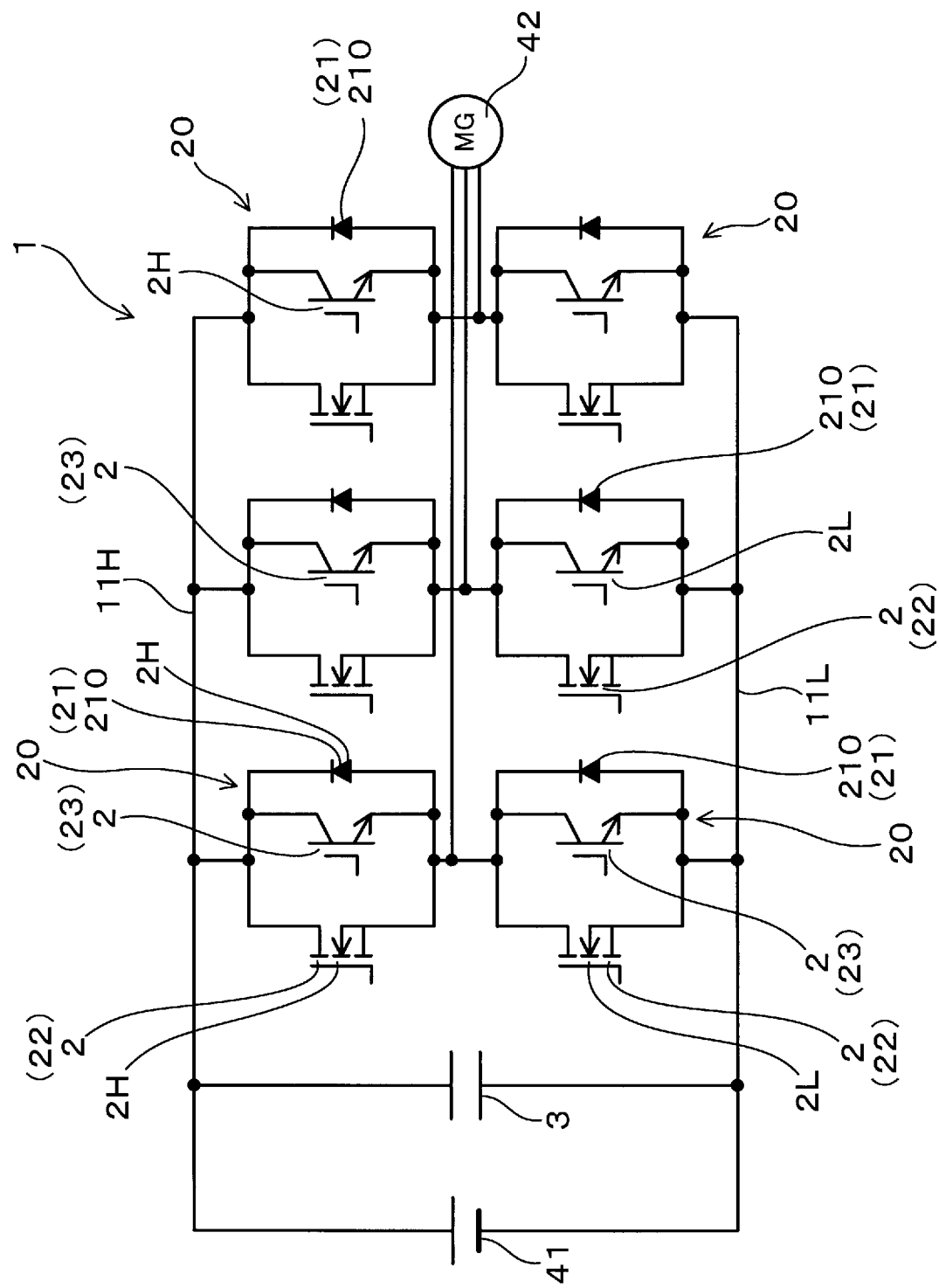
FIG. 6 is a circuit diagram showing a power conversion apparatus according to a third embodiment.
Figure 7:
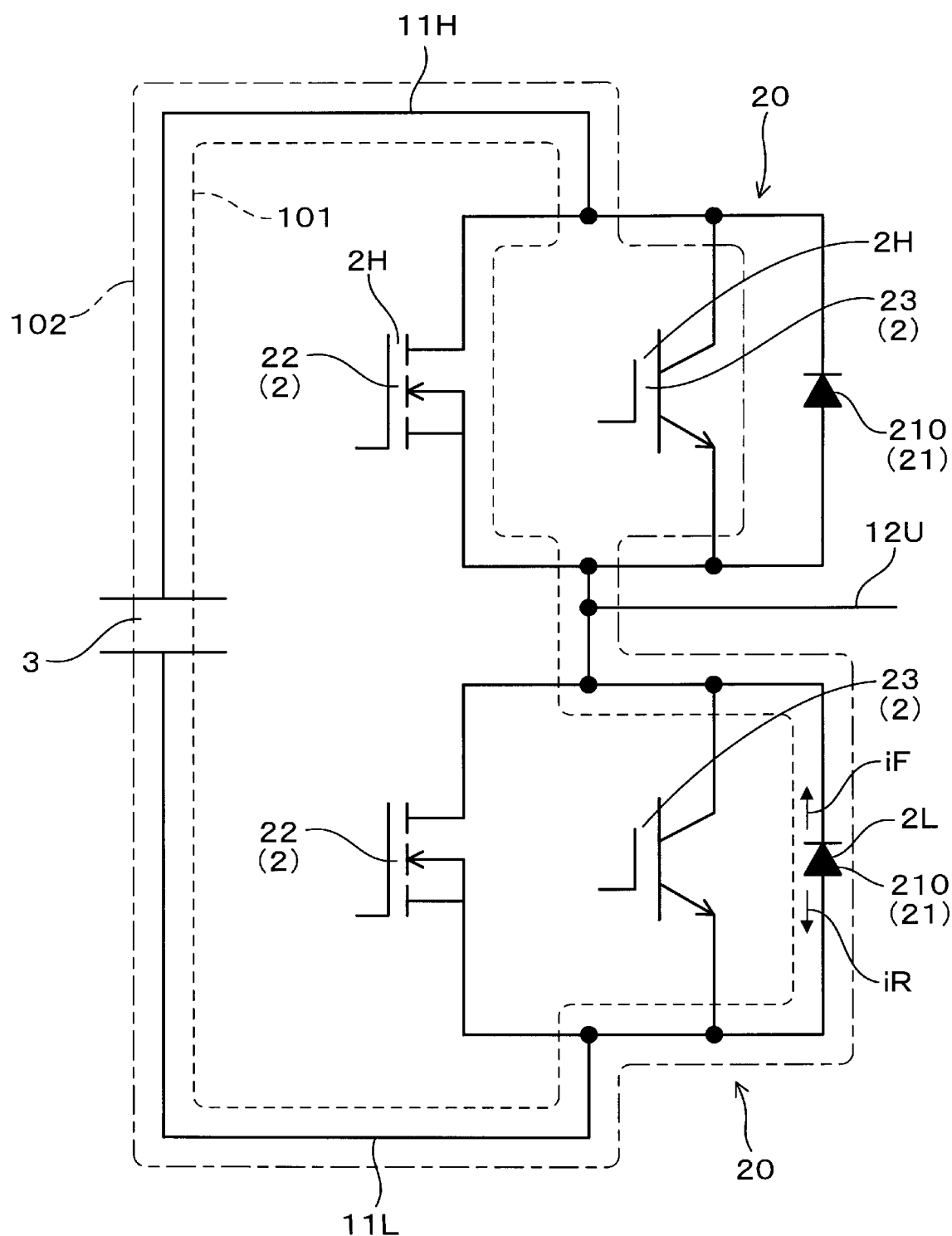
FIG. 7 is an explanatory diagram showing a last off closed circuit and a non-last off closed circuit when considering switching operation of an upper arm semiconductor device according to the third embodiment.
Figure 8:
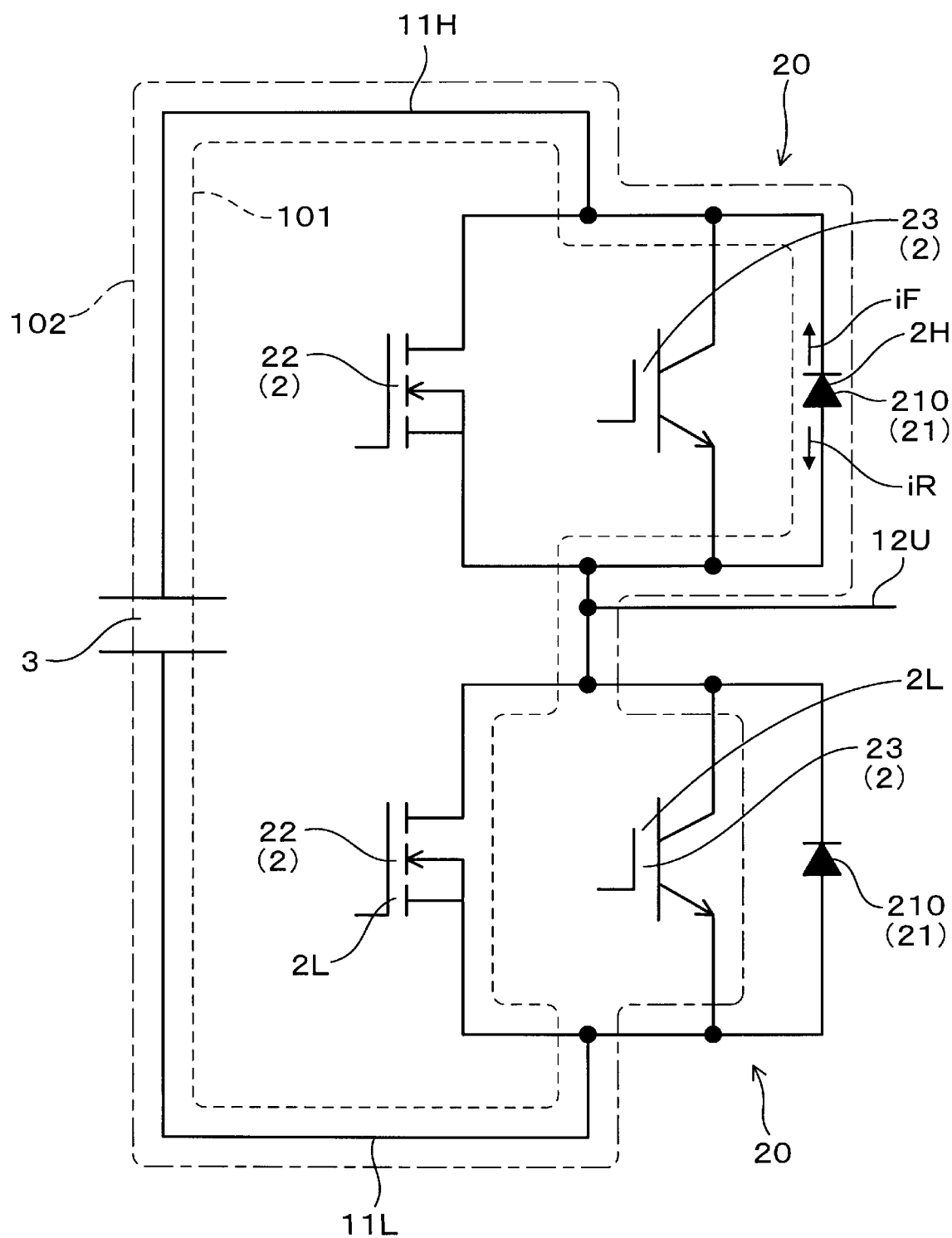
FIG. 8 is an explanatory diagram showing a last off closed circuit and a non-last off closed circuit when considering switching operation of a lower arm semiconductor device according to the third embodiment.

According to the third embodiment, as shown in FIGS. 6 to 8, another diode 210 other than the switching element 2 is used as a reflux element 21. Specifically, the diode 210 is reversely connected in parallel to the MOSFET and the IGBT that constitute the parallel-connected body 20.

As the diode 210, a PIN diode made of Si or a Schottky barrier diode made of SiC can be used.

As shown in FIGS. 7 and 8, according to the present embodiment, the last off closed circuit 101 is determined as a closed circuit path that passes through the last off element 22, the diode 210 disposed in an arm opposite to the last off element 22, and the capacitor 3. The non-last off closed circuit 102 is determined as a closed circuit path that passes through the non-last off element 23 connected in parallel to the last off element 22, the diode 210 disposed in an arm opposite to the last off element 22 and the capacitor 3.

Specifically, when focusing on the switching operation of the upper arm semiconductor device 2H, as shown FIG. 7, the last off closed circuit 101 is determined as a closed circuit including the last off element 22 of the upper arm semiconductor device 2H and the diode 210 of the lower arm semiconductor device 2L. Also, the non-last off closed circuit 102 is determined as a closed circuit including the non-last off element 23 of the upper arm semiconductor device 2H and the diode 210 of the lower arm semiconductor device 2L.

On the other hand, when focusing on the switching operation of the lower arm semiconductor device 2L, as shown in FIG. 8, the last off closed circuit 101 is determined as a closed circuit including the last off element 22 of the lower arm semiconductor device 2L and the diode 210 of the upper arm semiconductor device 2H. Also, the non-last off closed circuit 102 is determined as a closed circuit including the non-last off element 23 of the lower arm semiconductor device 2L and the diode 210 of the upper arm semiconductor device 2H. Similar to the first embodiment, inductance of the last off closed circuit 101 is smaller than that of the non-last off closed circuit 102. Other configurations are the same as that of the first embodiment.

Likewise, according to the present embodiment, similar operational effects as the first embodiment can be obtained. Note that a RC-IGBT in which an IGBT and a diode are integrated as a single element can be used to accomplish similar circuit configuration of the present embodiment.

Fourth Embodiment

Figure 9:
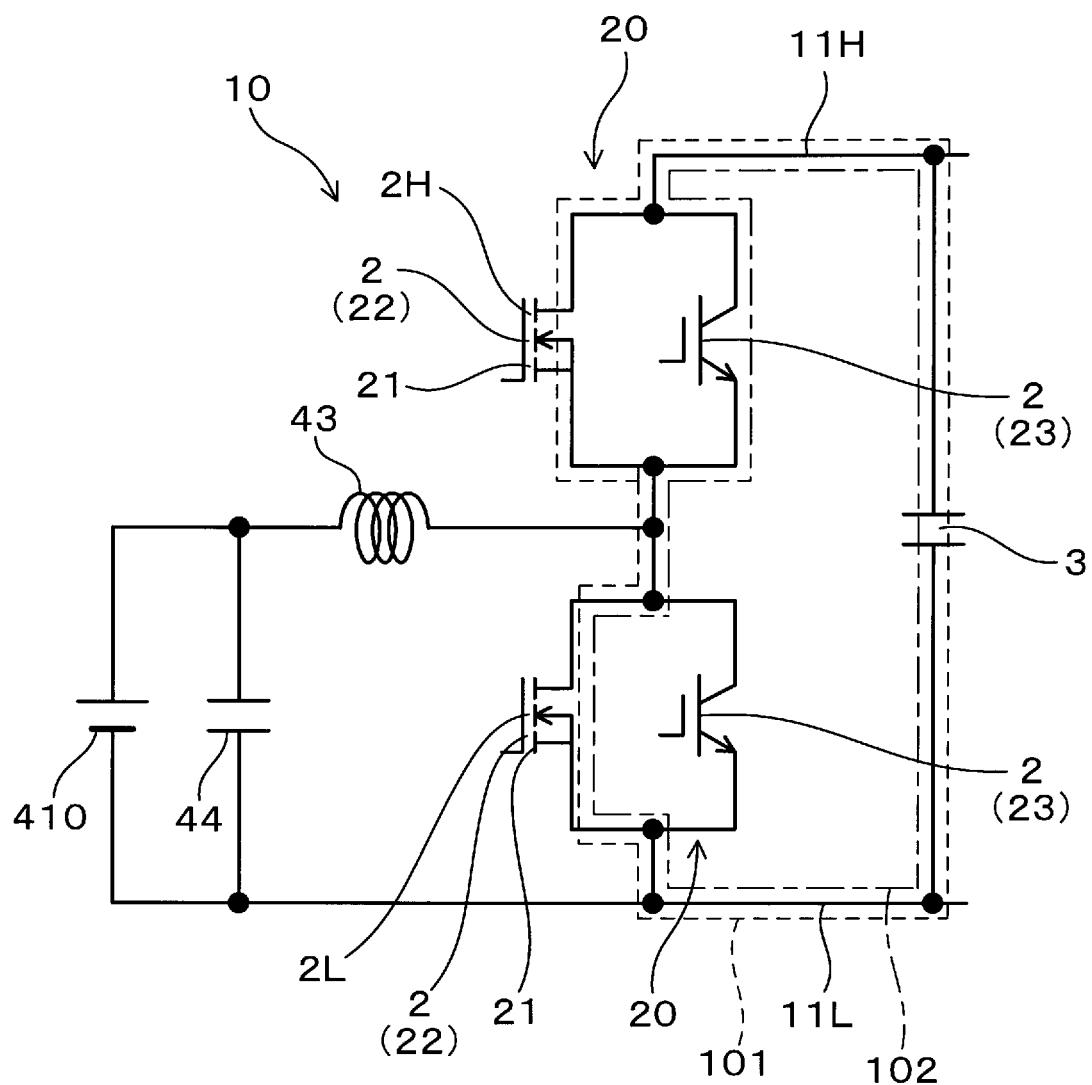
FIG. 9 is a circuit diagram showing a power conversion apparatus according to a fourth embodiment.

As shown in FIG. 9, a power conversion apparatus 10 according to the fourth embodiment provides a converter including an upper arm semiconductor device 2H and a lower arm semiconductor device 2L. Each of the upper arm semiconductor device 2H and the lower arm semiconductor device 2L is configured of, similar to the first embodiment, a parallel-connected body 20 in which two switching elements 2 are connected in parallel. The two switching elements 2 are MOSFET and IGBT.

The parallel-connected body 20 of the upper arm semiconductor device 2H and the parallel-connected body 20 of the lower arm semiconductor device 2L are mutually connected in series. A leg is composed of two parallel-connected bodies 20 which are connected in series. The leg is connected in parallel to the capacitor 3 between the high-potential line 11H and the low-potential line 11L.

The wiring between the upper arm semiconductor device 2H and the lower semiconductor device 2L is connected to the positive electrode of a DC power source 410 via a reactor 43. A filter capacitor 44 is provided such that one end thereof is connected between the reactor 43 and the positive electrode of the DC power source 410 and the other end is connected to the low-potential line 11L. The power conversion apparatus 10 according to the present embodiment controls the upper and lower arm semiconductor devices 2H and 2L to be appropriately on and off, thereby boosting the voltage of the DC power source 410 and outputting the boosted voltage to an electrical load (not shown) connected between the high-potential line 11H and the low-potential line 11L. Also, the power conversion apparatus 10 steps down high voltage power supplied from the electrical load side. As the electrical load, an inverter and a rotary electric machine introduced in the first embodiment can be connected to the power conversion apparatus.

Likewise, according to the power conversion apparatus 10 of the present embodiment, the inductance of the last off closed circuit 101 including the last off element 22 is smaller than the inductance of the non-last off closed circuit 102 including the non-last off element 23. Note that FIG. 9 illustrated an example of the last off closed circuit 101 and the non-last off closed circuit 102 which should be used as a comparison. Other configurations are the same as configuration of the first embodiment and similar operational effects can be obtained.

Similar to the previously described embodiments, the present embodiment can be modified in various ways such that the parasitic diode of a MOSFET, a MOSFET used for synchronous rectification, a diode connected in parallel to the switching element 2 or a diode included in a RC-IGBT can be utilized as the reflux element 21.

Fifth Embodiment

Figure 10:
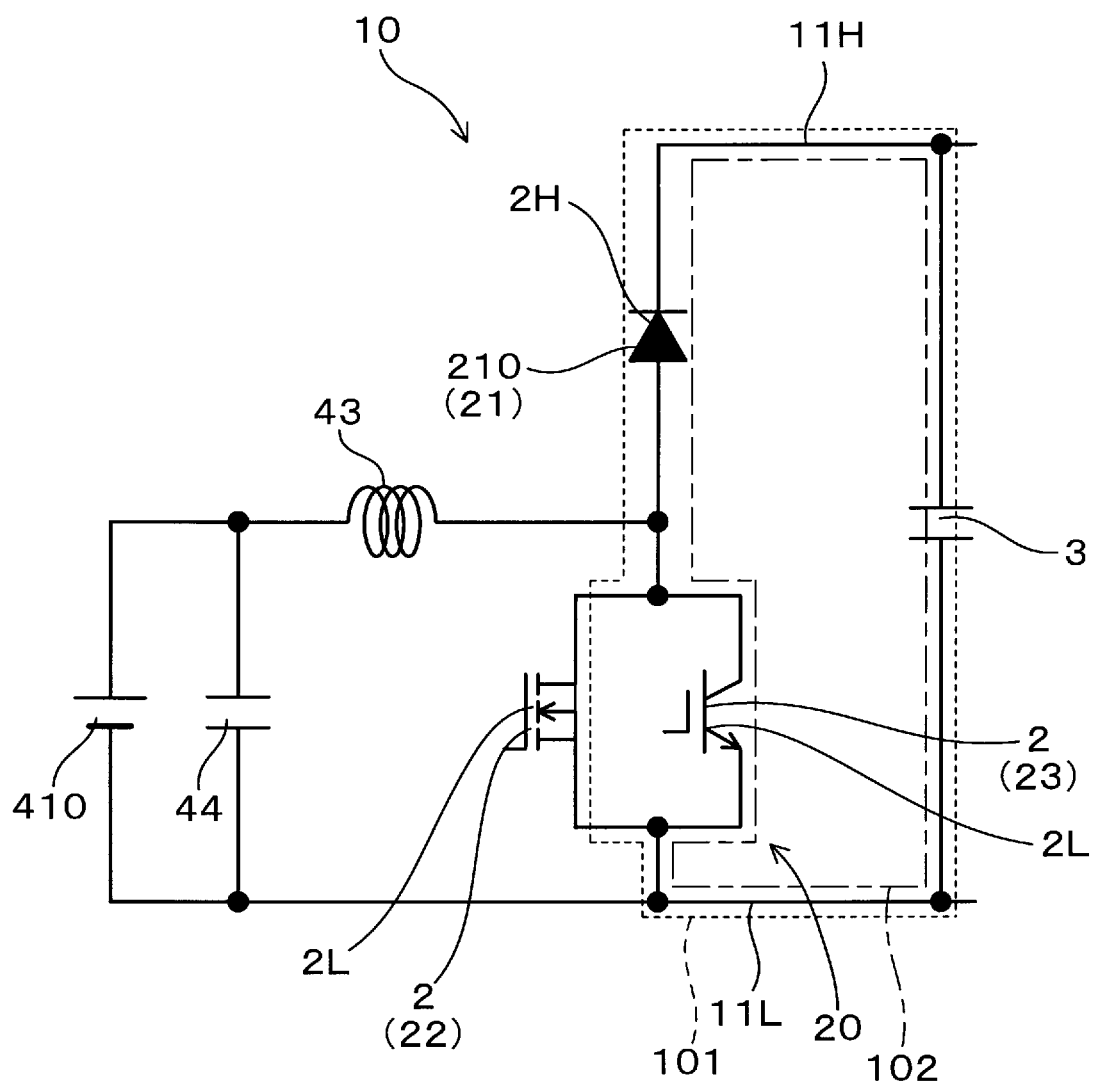
FIG. 10 is a circuit diagram showing a power conversion apparatus according to a fifth embodiment.

As shown in FIG. 10, the power conversion apparatus 10 according to the present embodiment is configured such that the upper arm semiconductor device 2H is composed of a diode 210 as the reflux element 21. In other words, only the diode 210 is provided in the upper arm without the switching element 2. The lower arm semiconductor device 2L is configured of a parallel-connected body 20 composed of two switching elements 2. The power conversion apparatus 10 according to the present embodiment serves as a converter only performing boost operation. The power conversion apparatus 10 according to the present embodiment may be used as a boost converter for fuel cell batteries.

According to the present embodiment, the last off closed circuit 101 is a closed circuit including the last off element 22 included in the parallel-connected body 20, the diode 210 as the upper arm semiconductor device 2H, and the capacitor 3. The non-last off closed circuit 102 is a closed circuit including the non-last off element 23 included in the parallel-connected body 20, the diode 210 as the upper semiconductor device 2H and the capacitor 3.

As the diode 210, PIN diode made of Si, or Schottky barrier diode made of SiC may be used, for example. Alternatively, as the diode 210, MOSFET or the like may be used. Other configuration are the same as that of the first embodiment. The present embodiment also obtain the same operational effects of the first embodiment.

Sixth Embodiment

Figure 11:
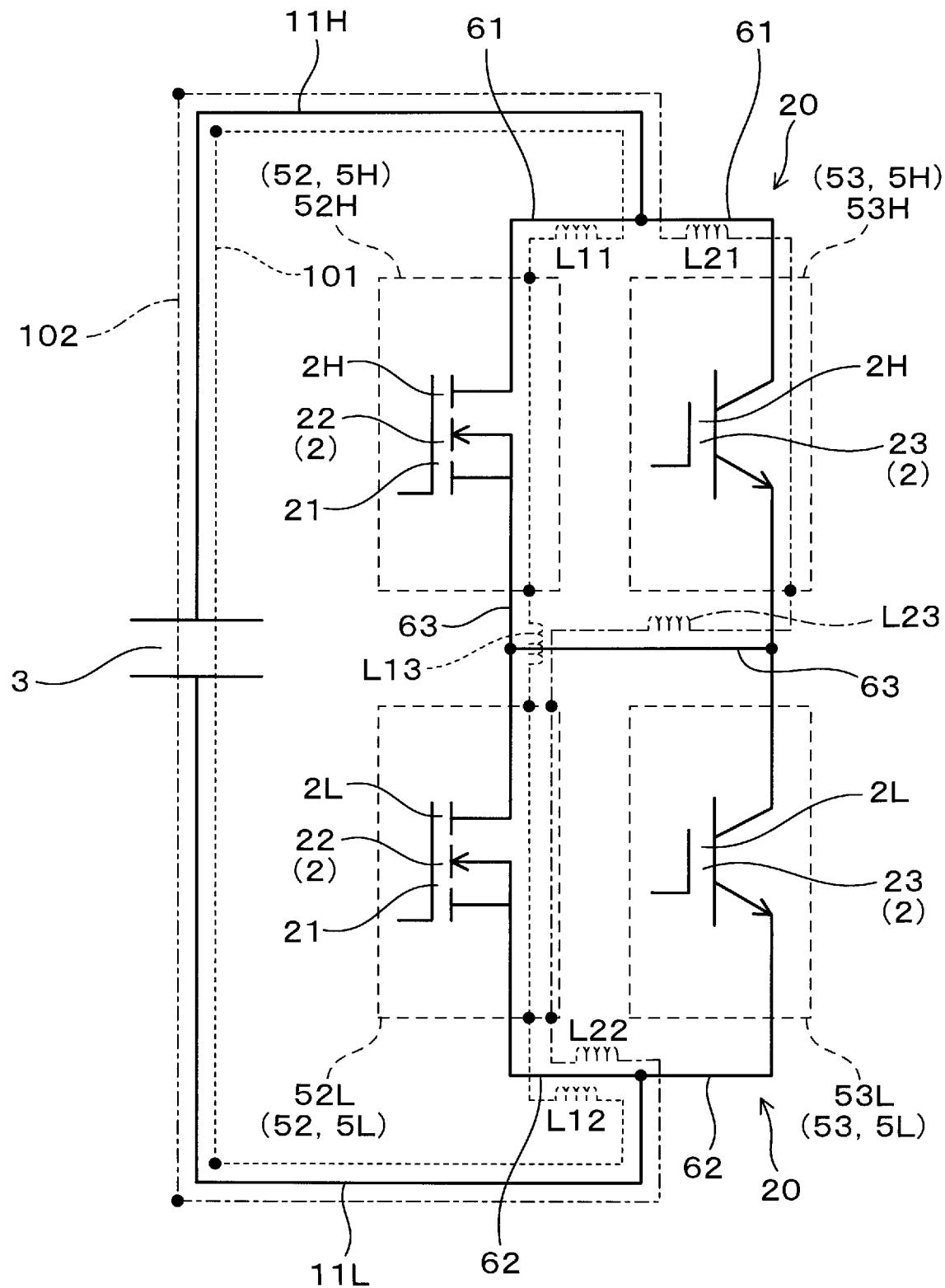
FIG. 11 is a circuit diagram showing a part of a power conversion apparatus according to a sixth embodiment.
Figure 12:
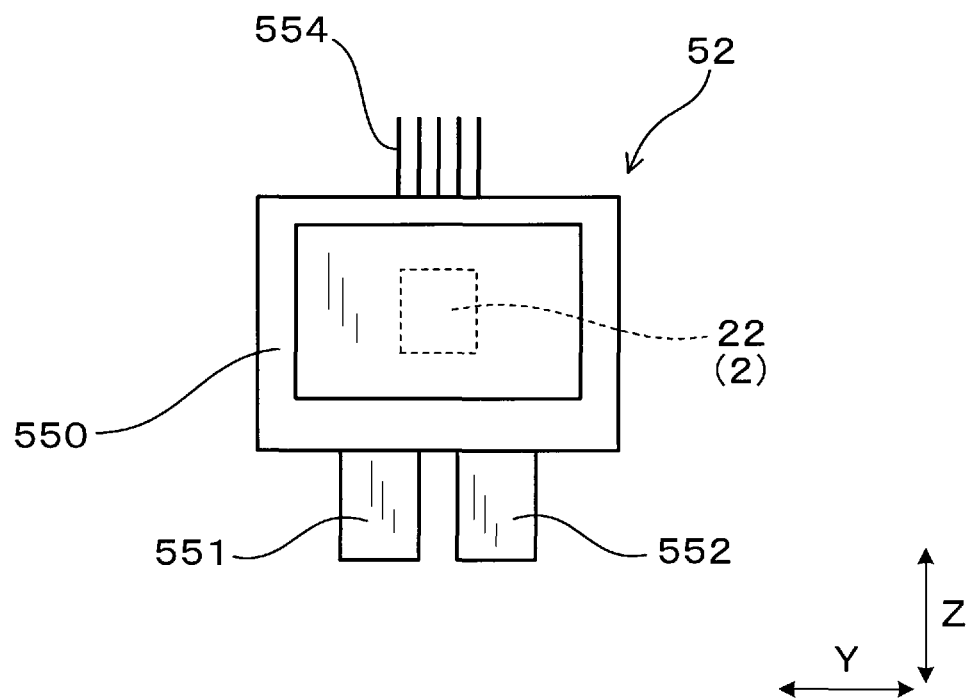
FIG. 12 is a front view showing a last off module according to a sixth embodiment.
Figure 13:
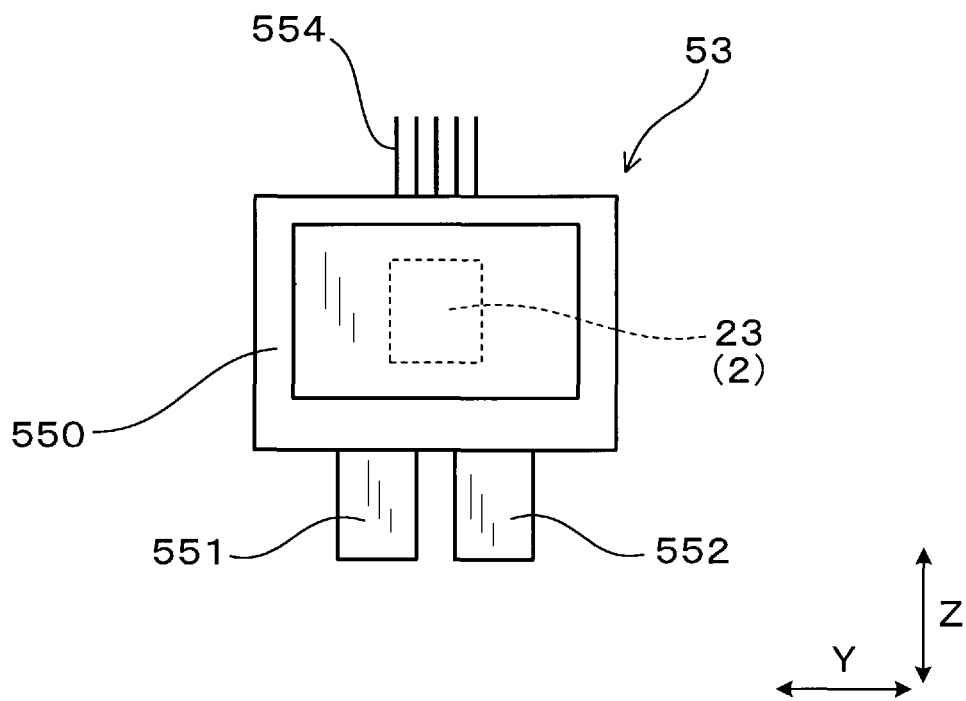
FIG. 13 is a front view showing a non-last off module according to the sixth embodiment.

As shown in FIGS. 11 to 16, according to the sixth embodiment, the switching elements 2 and the reflux element 21 are mounted on the semiconductor module (52H, 53H, 52L, 53L). Specifically, according to the present embodiment, the last off element 22, the non-last off element 23 and the reflux element 21 are mounted on the semiconductor module. As shown in FIGS. 11 to 13, the last off element 22 and the non-last off element 23 are mounted on the last off module 52 and the non-last off module 53 which are independent modules, that is, mutually independent of each other. In other words, a semiconductor module on which the last off element 22 is mounted is the last off module 52 and a semiconductor module on which the non-last off element 23 is mounted is the non-last off module 53.

According to the present embodiment, both of the upper arm semiconductor device 2H and the lower arm semiconductor device 2L are mounted on the upper arm module 5H and the lower arm module 5L which are independent semiconductor modules. In other words, the last off element 22 of the upper arm semiconductor device 2H, the non-off element 23 of the upper arm semiconductor device 2H, the last off element 22 of the lower arm semiconductor device 2L are mounted on mutually independent semiconductor modules. According to the present embodiment, the semiconductor module on which the last off element 22 of the upper arm semiconductor device 2H is mounted is referred to as a semiconductor module 52H, the semiconductor module on which the non-last off element 23 of the upper arm semiconductor 2H is mounted is referred to as a semiconductor module 53H, the semiconductor module on which the last off element 22 of the lower arm semiconductor device 2L is mounted is referred to as a semiconductor module 52L, and the semiconductor module on which the non-last off element 23 of the lower arm semiconductor device 2L is mounted is referred to as a semiconductor module 53L.

Each of the last off closed circuit 101 and the non-last off closed circuit 102 include semiconductor modules, the capacitor 3, and bus bars 61, 62 and 63. The total inductance of the bus bars 61, 62 and 63 included in the last off closed circuit 101 is smaller than that of the bus bars 61, 62 and 63 included in the non-last off closed circuit 102. Note that the last off closed circuit 101 and the non-last off closed circuit 102 shown in FIG. 11 are defined as the last off closed circuit and the non-last off closed circuit respectively, which should be compared when focusing on the switching operation of the last off element 22 of the upper arm semiconductor device 2H.

The upper arm module 5H and the lower arm module 5L are mutually connected by using an intermediate bus bar 63. Also, the upper arm module 5H is connected to the capacitor 3 by using a high potential bus bar 61 that constitutes the high-potential line 11H. The lower arm module 5L is connected to the capacitor 3 by using a low potential bus bar 62 that constitutes the low-potential line 11L. The total inductance of the high potential bus bar 61, the low potential bus bar 62 and the intermediate bus bar 63 included in the last off closed circuit 101 is smaller than the total inductance of the high potential bus bar 61, the low potential bus bar 62 and the intermediate bus bar 63 included in the non-last off closed circuit 102.

As shown in FIG. 11, the inductance of the high potential bus bar 61 included in the last off closed circuit 101 is defined as L11, the inductance of the low potential bus bar 62 included in the last off closed circuit 101 is defined as L12, and the inductance of the intermediate bus bar 63 included in the last off closed circuit 101 is defined as L13. Further, the inductance of the high potential bus bar 61 included in the non-last off closed circuit 102 is defined as L21, the inductance of the low potential bus bar 62 included in the non-last off closed circuit 102 is defined as L22, the inductance of the intermediate bus bar 63 included in the non-last off closed circuit 102 is defined as L23. At this time, relationship L11+L12+L13<L21+L22+L23 is satisfied. In particular, according to the present embodiment, L11<L21 and L13<L23 are satisfied. In the respective closed circuits, although inductance may be present in other locations, in FIG. 11, only the focused inductance components are illustrated. The same applies to other figures.

Figure 14:
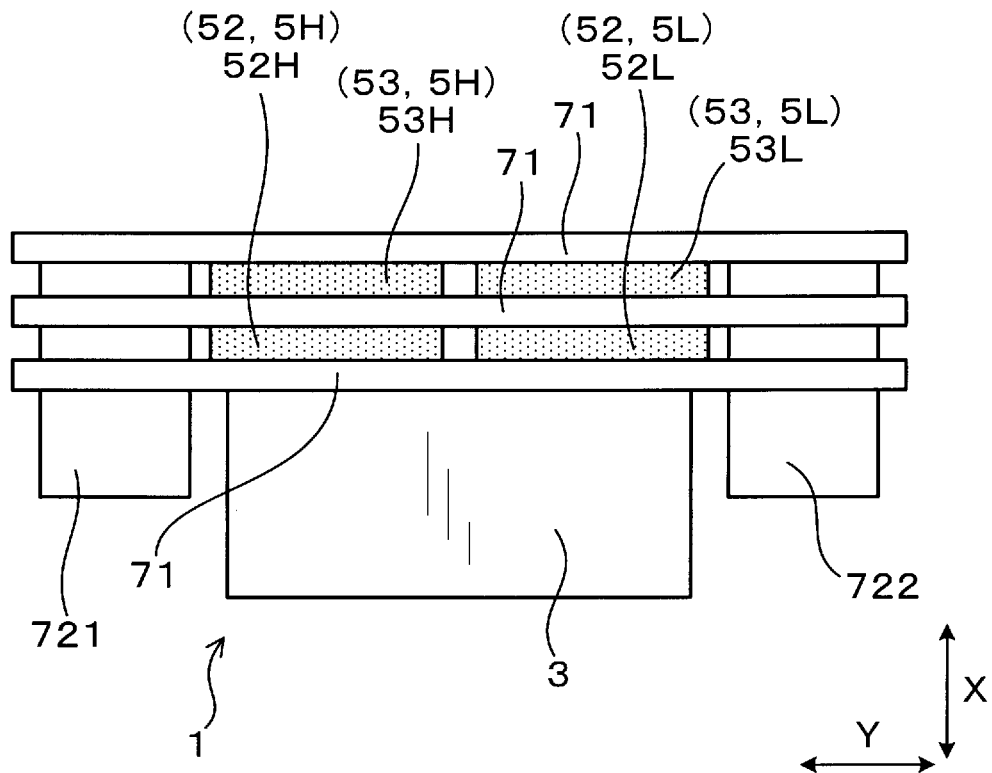
FIG. 14 is a plan view of a part of the power conversion apparatus according to the sixth embodiment.

The specific structure of the power conversion apparatus 1 of the present embodiment is illustrated in FIGS. 12 to 16. As shown in FIG. 14, the power conversion apparatus 1 is provided with the semiconductor modules 52H, 53H, 52L and 53L arranged therein. As shown in FIGS. 12 to 16, each of the semiconductor modules is configured of a module body 550 formed in a card shape and two power terminals 551 and 552 protruded from the module body 550 in a direction perpendicular to the thickness direction X thereof. Also, as shown in FIGS. 12 and 13, the semiconductor module includes a control terminal 54 protruded from the module body 550 in an opposite side with respect to the power terminals 551 and 552. Note that a direction in which the control terminal 54 and the power terminals 551 and 552 protrude is defined as a height direction Z for the sake of convenience. Also, a direction perpendicular to both the thickness direction X and the height direction Z is defined as a width direction Y for the sake of convenience.

As shown in FIG. 14, two upper arm modules 5H, that is, the semiconductor modules 52H and 53H are arranged in the thickness direction X. Also, two lower arm modules 5L, that is, the semiconductor modules 52L and 53L are arranged in the thickness direction X.

On the other hand, two last off modules 52, that is, the semiconductor modules 52H and 52L are arranged in the width direction Y. Further, two non-last off modules 53, that is, the semiconductor modules 53H and 53L are arranged in the width direction Y. Moreover, two non-last off modules 53, that is, the semiconductor modules 53H and 53L are arranged in the width direction Y.

The capacitor 3 is arranged to be laminated on these semiconductor modules 52H, 53H, 52L and 53L in the thickness direction X. The semiconductor modules 52H and 52L among the above-described four semiconductor modules 52H, 53H, 52L and 53L, that is, the last off modules 52 are located closer to the capacitor 3 compared to the locations at which the semiconductor modules 53H and 53L, that is, the non-last off modules 53 are disposed. In other words, the last off modules 52 are located closer to the capacitor 3 compared to the locations of the non-last off modules 53 connected in parallel to the last off modules 52.

Figure 15:
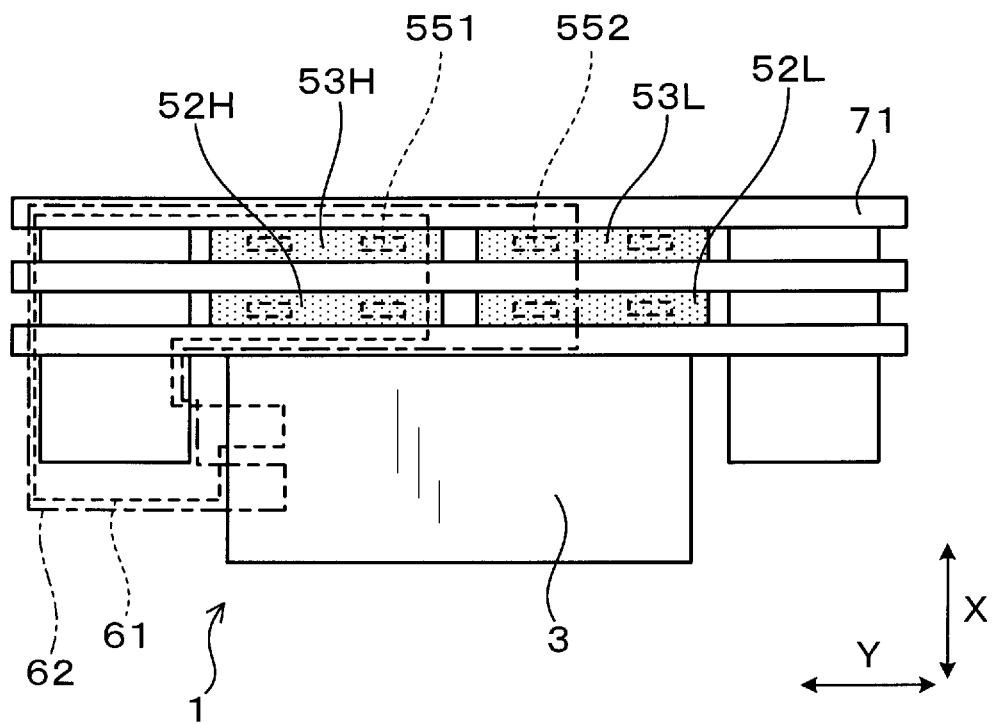
FIG. 15 is a plan view showing a part of the power conversion apparatus including a part of bus bar according to the sixth embodiment.
Figure 16:
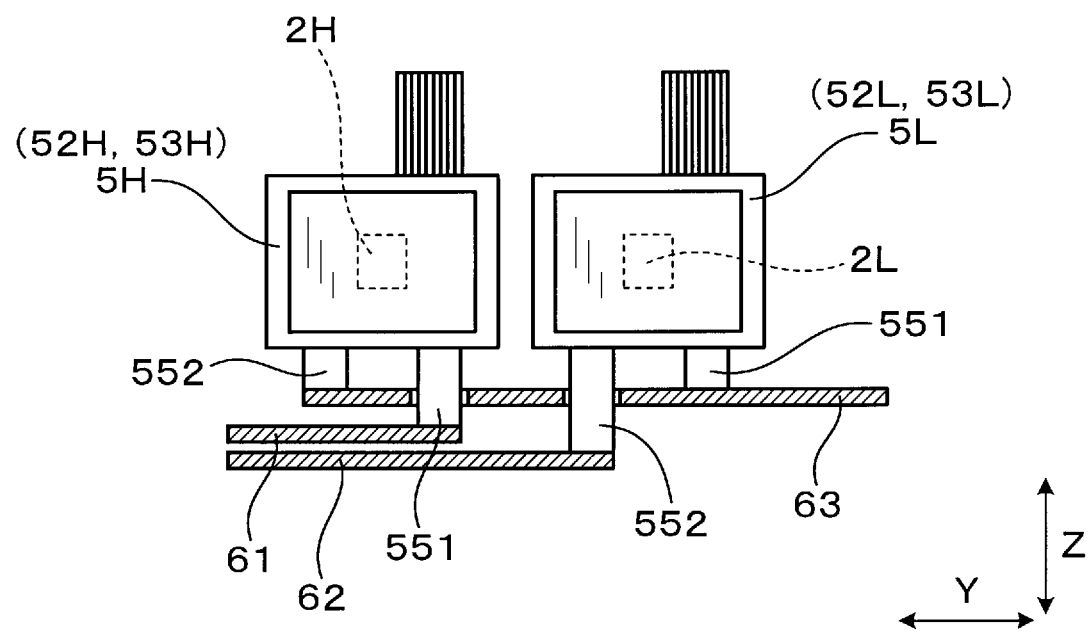
FIG. 16 is a front view showing a connection state between an upper arm module, a lower arm module and a bus bar according to the sixth embodiment.

As shown in FIGS. 15 and 16, the semiconductor modules 52H, 53H, 52L and 53L are connected to the capacitor 3 with the power terminals 551 and 552 via the high potential bus bar 61 and the low potential bus bar 62. Also, the upper arm module 5H (52H, 53H) and the lower arm module 5L (52L, 53L) are connected at the power terminals 552 and 551 via an output bus bar 63. As described, the last off modules 52 (52H, 52L) are located closer to the capacitor 3 compared to the locations of the last off modules 53 (53H, 53L).

Accordingly, the length of a current path between the last off modules 52 (52H, 52L) and the capacitor 3 via the high potential bus bar 61 is shorter than the distance of a current path between the non-last off modules 53 (53H, 53L) and the capacitor 3 via the high potential bus bar 61. Similarly, the distance of a current path between the last off modules 52 (52H, 52L) and the capacitor 3 via the low potential bus bar 62 is shorter than the distance of a current path between the non-last off module 53 (53H, 53L) and the capacitor 3 via the low potential bus bar 62.

As shown in FIGS. 14 and 15, the semiconductor modules 52H, 53H, 52L an 53L are laminated in the thickness direction X together with cooling pipes 71 which cool the semiconductor modules 52H, 53H, 52L an 53L. Each of the semiconductor modules 52H, 53H, 52L and 53L contacts with the cooling pipes 71 at both two major surfaces thereof in the thickness direction X. The plurality of cooling pipes 71 are mutually coupled in the vicinity of both ends thereof in the width direction Y. Further, the cooling pipe 71 provided in one side in the lamination direction (i.e., thickness direction X) includes a coolant introduction pipe 721 that introduces coolant and a coolant exhausting pipe 722 that exhausts the coolant. The capacitor 3 contacts with the coolant pipe 71 which is provided in the one side in the lamination direction. The capacitor 3 is located adjacently to the semiconductor modules 52H and 52L via the cooling pipe 71.

In FIGS. 14 and 15, only the semiconductor modules 52H, 53H, 52L and 53L which constitute a leg in the power conversion apparatus 1 are illustrated. The semiconductor modules 52H, 53H, 52L and 53L which constitute two other legs can be laminated in the opposite side with respect to the laminate shown in FIGS. 14 and 15 in the thickness direction X via the capacitor 3 therebetween. Similar to the semiconductor modules 52H, 53H, 52L and 53L shown in FIGS. 14 and 15, the semiconductor modules 52H, 53H, 52L and 53L which constitute other two legs can be laminated alternately with the cooling pipes 71. Also, for these semiconductor modules 52H, 53H, 52L and 53L, the last off module 52 (52H, 52L) among the semiconductor modules 52H, 53H, 52L and 53L which constitutes the common leg is disposed closer to the capacitor 3 compared to the location of the non-last off module 53 (53H, 53L). Other configurations are the same as the first embodiment.

According to the present embodiment, inductances of the bus bars 61, 62, 63 between the semiconductor modules and the capacitor 3 can be adjusted so as to make the inductance of the last off closed circuit 101 to be smaller than that of the non-last off closed circuit 102. Therefore, it is not necessary to adjust inductances in the internal structure of the semiconductor module, for example, it is not necessary to set differences in inductances in the semiconductor module. In other words, structures of the respective semiconductor modules 52H, 53H, 52L, 53L can be approximately the same. Moreover, inductances of the current paths are set to be different between the high potential bus bar 61 and the low potential bus bar 62, whereby the inductance of the last off closed circuit 101 can readily be small without complicating the wirings of the bus bars 61, 62 and 63.

The last off module 52 is disposed to be closer to the capacitor 3 than the non-last off module 53 is. Thus, the semiconductor modules 52H, 53H, 52L and 53L are appropriately arranged, thereby readily reducing the inductance of the last off closed circuit 101. In addition, operational effects similar to the first embodiment can be obtained.

Seventh Embodiment

As shown in FIGS. 17 to 22, according to the seventh embodiment, the upper arm semiconductor devices 2H and the lower arm semiconductor devices 2L are mounted on common modules 520 and 530 in which these upper and lower semiconductor devices are commonly mounted on the same semiconductor module.

The common modules 520 and 530 are connected to the capacitor 3 via the high potential bus bar 61 that constitutes the high potential line 11H and the low potential bus bar 11L that constitutes the low potential line 11L. The total inductance of the high potential bus bar 61 and the low potential bus bar 62 included in the last off closed circuit 101 is smaller than the total inductance of the high potential bus bar 61 and the low potential bus bar 62 included in the non-last off closed circuit 102.

Figure 17:
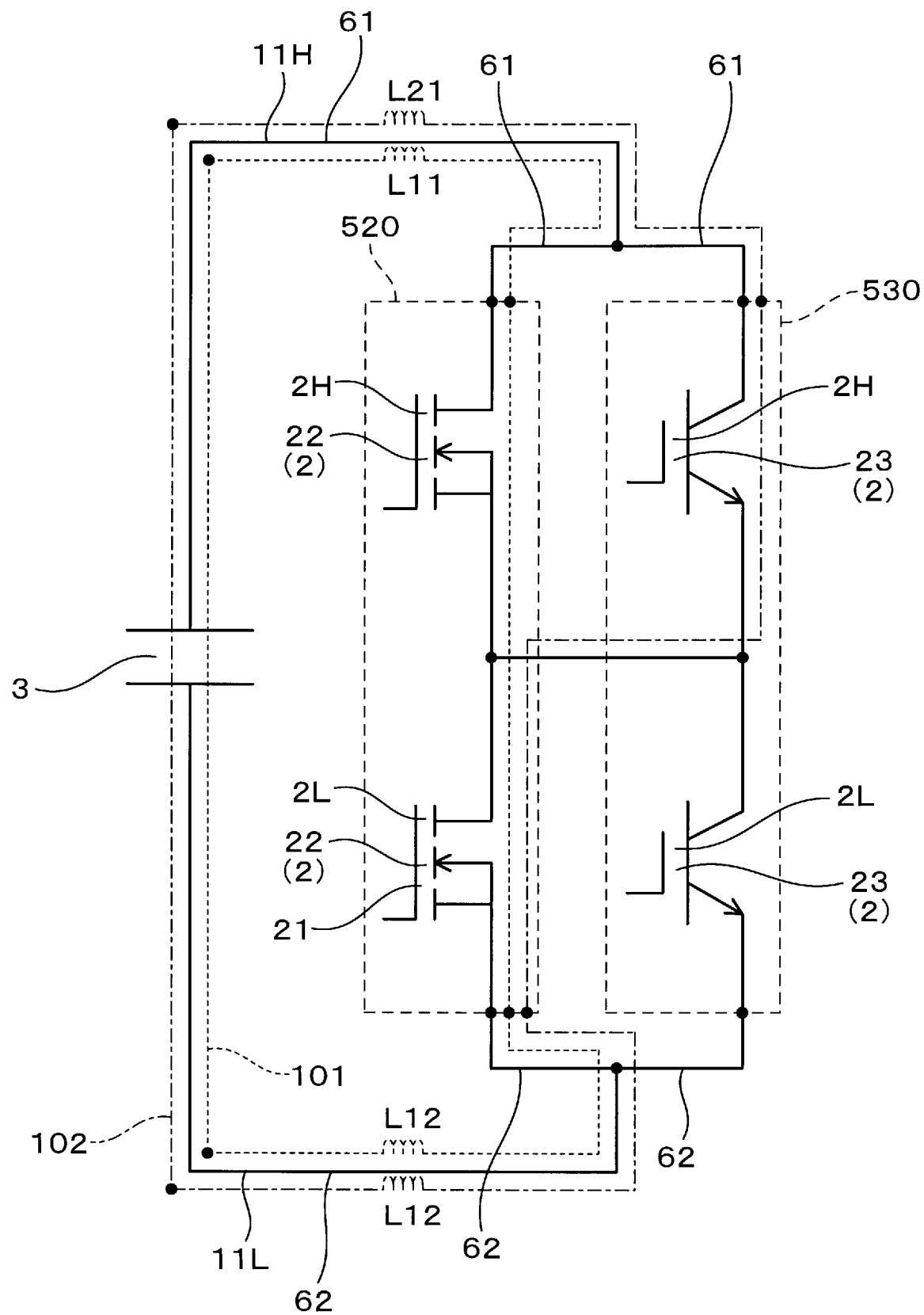
FIG. 17 is an explanatory diagram showing a last off closed circuit and a non-last off closed circuit when considering switching operation of an upper arm semiconductor device according to a seventh embodiment.
Figure 18:
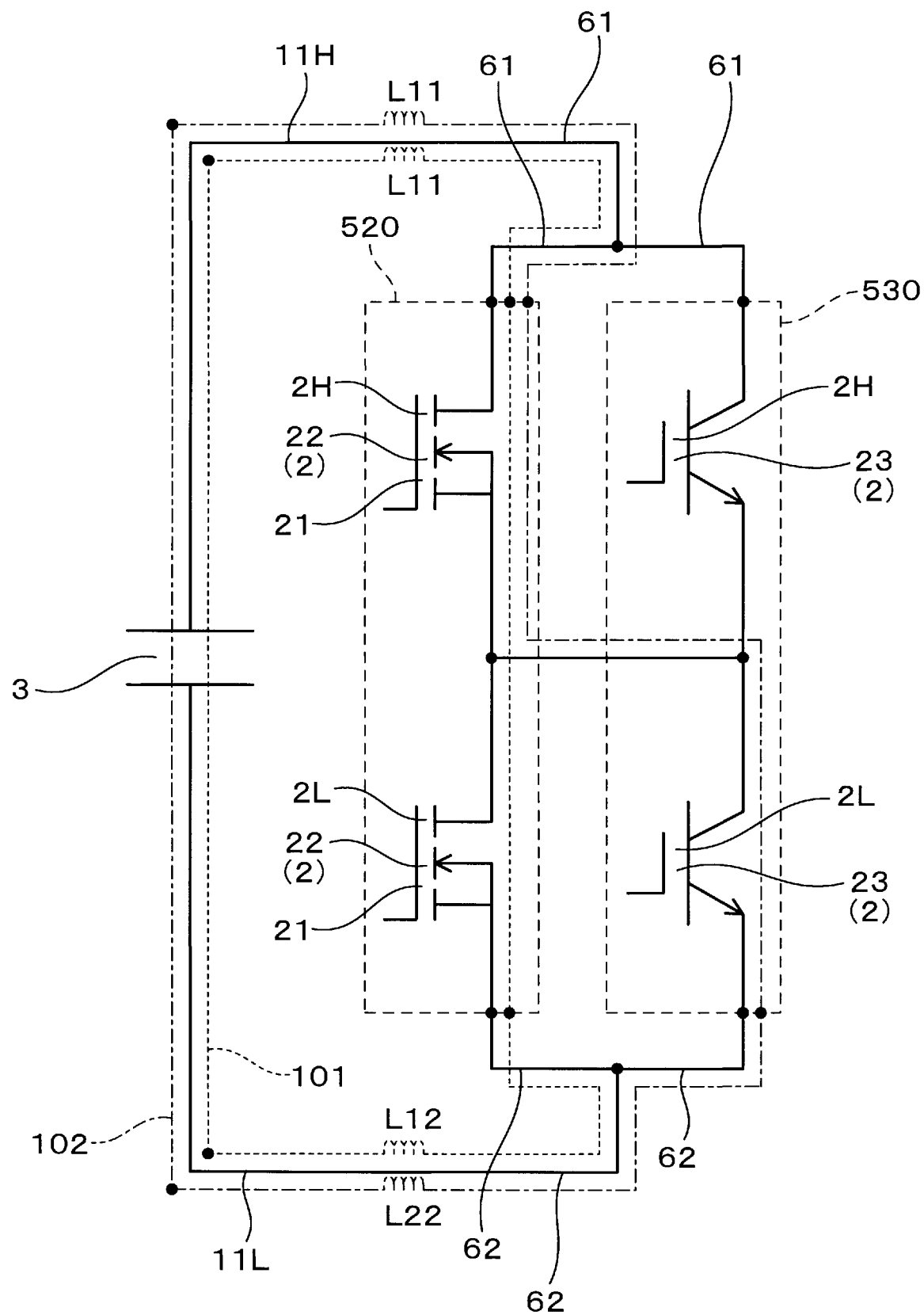
FIG. 18 is an explanatory diagram showing a last off closed circuit and a non-last off closed circuit when considering switching operation of an upper arm semiconductor device according to the seventh embodiment.

As shown in FIGS. 17 and 18, the inductance of the high potential bus bar 61 between the capacitor 3 and the common module 520 in which the last-off element 22 is mounted is defined as L11. The inductance of the low potential bus bar 62 between the capacitor 3 and the common module 520 in which the last-off element 22 is mounted is defined as L12. The inductance of the high potential bus bar 61 between the capacitor 3 and the common module 530 in which the non-last off element 23 is mounted is defined as L21. The inductance of the low potential bus bar 62 between the capacitor 3 and the common module 530 in which the non-last off element 23 is mounted is defined as L22.

As shown FIG. 17, considering the last off closed circuit 101 and the non-last off closed circuit 102 which should be compared when focusing on the switching operation of the upper arm semiconductor device 2H, a condition of L11+L12<L21+L12 is satisfied. Also, as shown in FIG. 18, considering the last off closed circuit 101 and the non-last off closed circuit 102 which should be compared when focusing on the switching operation of the lower arm semiconductor device 2L, a condition of L11+L12<L11+L22 is satisfied. Hence, taking this into consideration as a whole, a condition of L11<L21 and L12<L22 is preferably satisfied.

Figure 19:
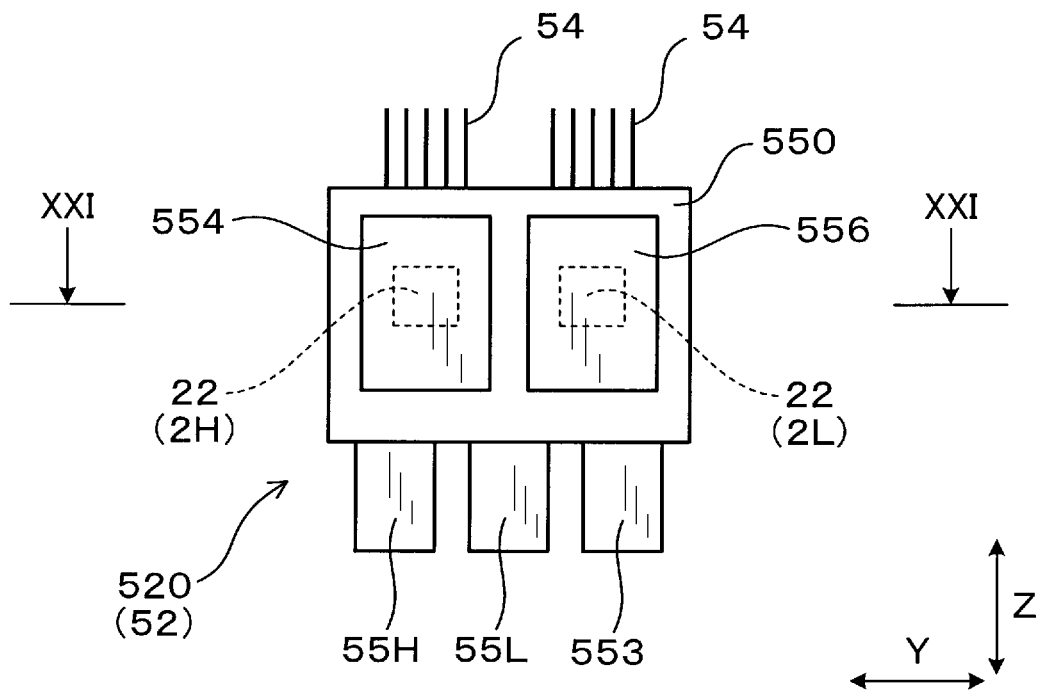
FIG. 19 is a front view showing a common module as a last off module according to the seventh embodiment.
Figure 20:
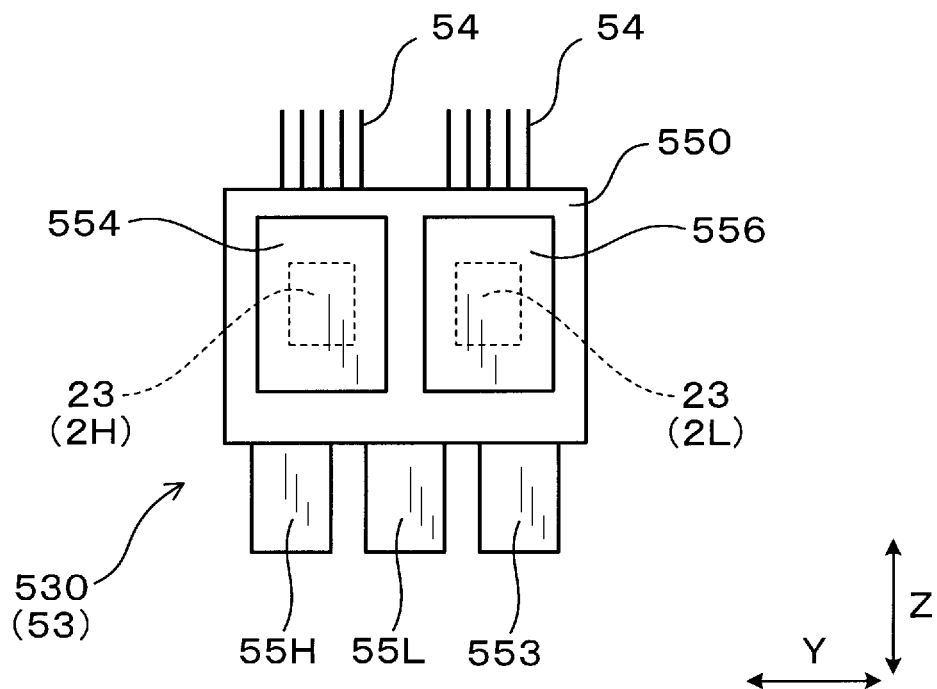
FIG. 20 is a front view showing a common module as a non-last off module according to the seventh embodiment.
Figure 21:
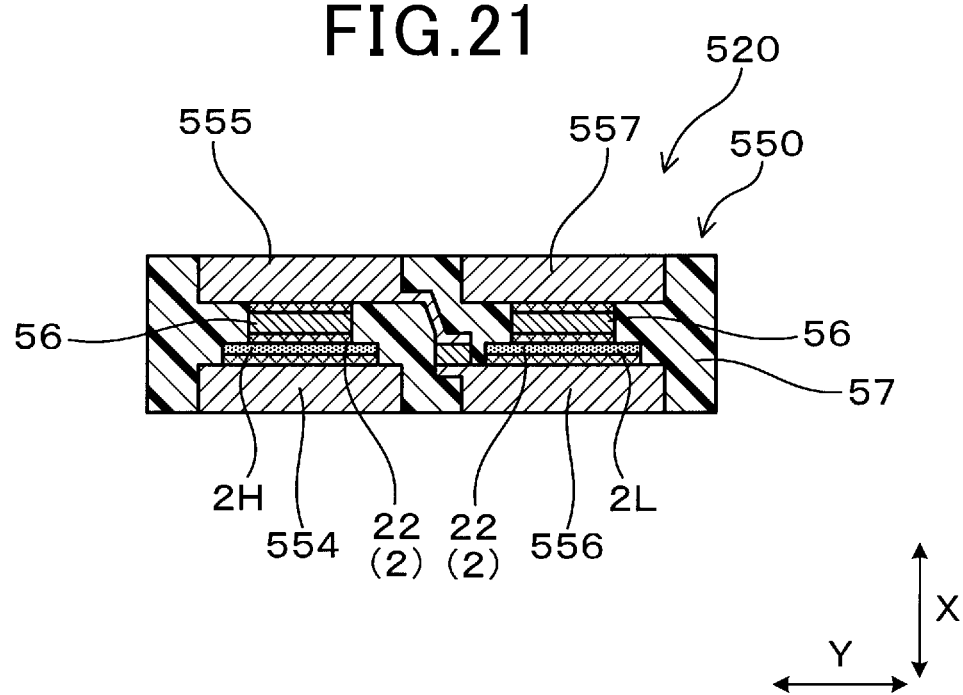
FIG. 21 is a cross-sectional view taken along a line XXI-XXI of FIG. 19.

As shown in FIGS. 19 to 21, the common modules 520 and 530 are provided with the upper arm semiconductor devices 2H and the lower arm semiconductor devices 2L. Also, each of the common modules 520 and 530 includes a high potential terminal 55H and a low potential terminal 55L as power terminals, and further includes an output terminal 553. The high potential terminal 55H is connected to the upper arm semiconductor device 2H in the module body 550. The low potential terminal 55L is connected to the lower arm semiconductor device 2L in the module body 550. The output terminal 553 is connected to the upper arm semiconductor device 2H and the lower arm semiconductor device 2L. The high potential terminal 55H, the low potential terminal 55L and the output terminal 553 are provided protruding from the module body 550.

The high potential terminal 55H, the low potential terminal 55L and the output terminal 553 are protruded from the module body 550 towards the same direction in the height direction Z. Also, as shown in FIG. 21, in the common module 520, the upper arm semiconductor device 2H is disposed between two electrode plates 554 and 555 which are disposed facing to each other, via a spacer 56. Similarly, the lower arm semiconductor device 2L is disposed between two electrode plates 556 and 557 which are disposed facing to each other, via a spacer 56. The electrode plates 554 and 556 and the switching element 2, the switching element 2 and the spacer 56, the spacer 56 and the electrode plates 555 and 557 are mutually joined by soldering. Thus, a laminate structure (i.e., laminate) is composed of the upper arm semiconductor device 2H and two electrode plates 554 and 555 and the spacer 56, and another laminate is composed of the lower arm semiconductor device 2L and two electrode plates 556 and 557 and the spacer 56.

The two pair of laminates are integrated in a resin portion 57 to constitute a single common module 520. One electrode plate 554 laminated on the upper arm semiconductor device 2H is connected to the high potential terminal 55H. One electrode plate 557 laminated on the lower arm semiconductor device 2L is connected to the lower potential terminal 55L. The other electrode plate 555 laminated on the upper arm semiconductor device 2H and the other electrode plate 556 laminated on the lower arm semiconductor 2L are electrically connected to each other. These plates are electrically connected to the output terminal 553.

The above-described four electrode plates 554, 555, 556 and 557 are exposed to both major surfaces of the common module 520 in the thickness direction X and serves as heat dissipation plates. Note that the electrode plate 554 connected to the high potential terminal 55H and the electrode plate 557 connected to the lower potential terminal 55L are exposed to mutually opposite surfaces of the common module 520. Further, two electrode plates 555 and 556 electrically connected to the output terminal 553 are exposed to mutually opposite surfaces of the common module 520. Also, the other common module 530 has a similar structure of the above-described common module 520 except that the type of semiconductor element is different from the common module 520.

Figure 22:
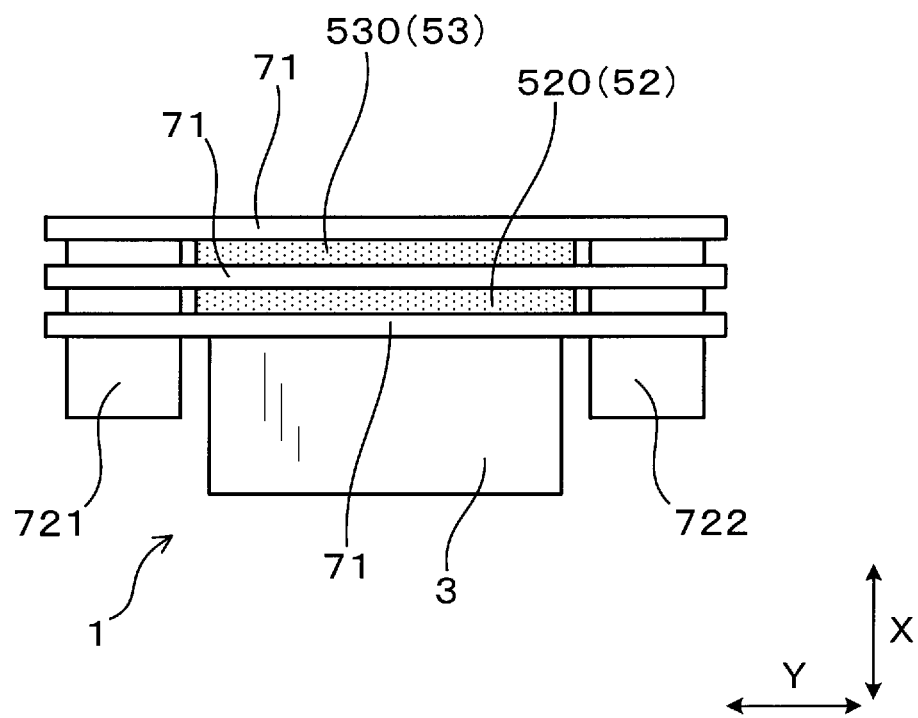
FIG. 22 is a plan view showing a part of a power conversion apparatus according to the seventh embodiment.

Two common modules 520 and 530 are present in which each module forms one leg. Among these, as shown in FIG. 19, one common module 520 is the last off module 52 on which the last off element 22 is mounted, and as shown in FIG. 20, the other common module 530 is the non-last off module 53 on which the non-last off element 23 is mounted. As shown in FIG. 22, the power conversion apparatus 1 is configured of two common modules 520 and 530 laminated in the thickness direction X. The common module 520 as the last off module 52 is disposed closer to the capacitor 3 than the common module 520 as the non-last off module 53 is. Other configuration is the same as that of the sixth embodiment.

According to the present embodiment, since the upper arm semiconductor device 2H and the lower arm semiconductor device 2L are mounted to corresponding one common module, that is, common module 520 or 530, the size of the power conversion apparatus 1 can readily be smaller. Also, the last off element 22 and the reflux element 21 in the opposite arm are mounted to a single common module 520, 530 so that the inductance of the last off closed circuit 101 can be effectively small. Moreover, in the present embodiment, operational effects similar to that of the sixth embodiment are obtained.

Eighth Embodiment

According to the eighth embodiment, as shown in FIGS. 23 to 26, semiconductor elements in two parallel-connected bodies 20 that form one leg are mounted to a leg common module 500.

Figure 23:
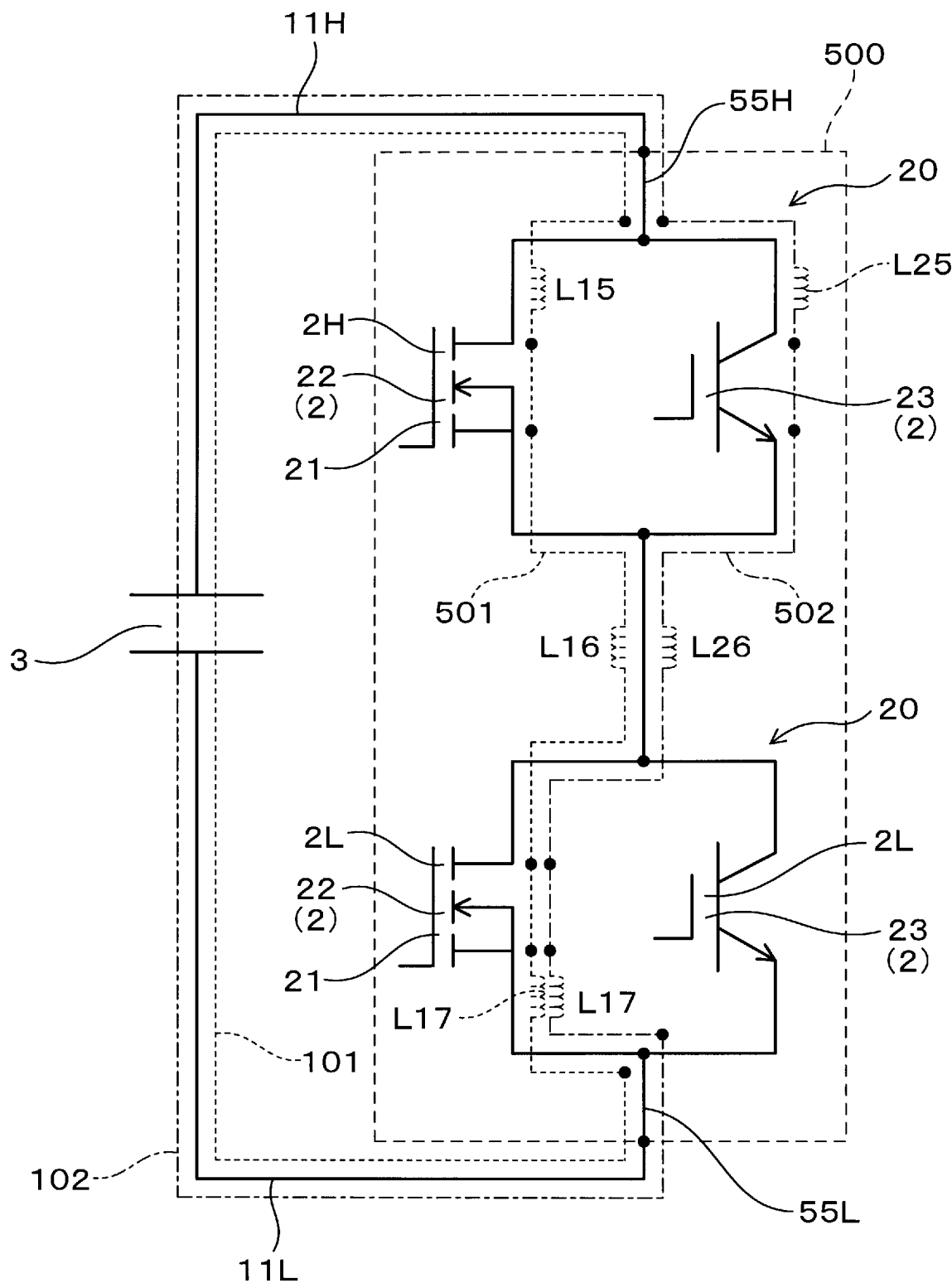
FIG. 23 is an explanatory diagram showing a last off closed circuit and a non-last off closed circuit when considering switching operation of an upper arm semiconductor device according to a eighth embodiment.

In the present embodiment, as shown in FIG. 23, the parallel-connected body 20 of the upper arm semiconductor 2H includes the last off element 22, the non-last off element 23, and the reflux element 21. The parallel-connected body 20 of the lower arm semiconductor 2L includes the last off element 22, the non-last off element 23, and the reflux element 21. The last off element 22, the non-last off element 23, and the reflux element 21 in the upper arm semiconductor device 2H, and the last off element 22, the non-last off element 23, and the reflux element 21 in the lower arm semiconductor device 2L are mounted on the leg common module 500 as a single common semiconductor module. It should be noted that one MOSFET serves as the last off element 22 and the reflux element 21.

Figure 25:
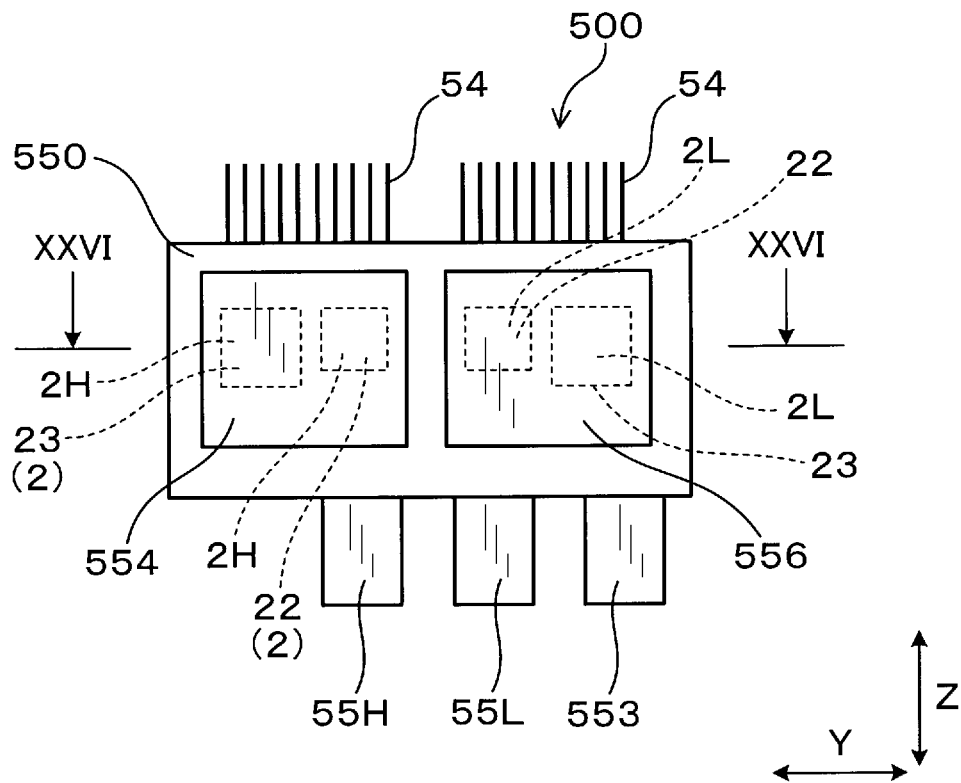
FIG. 25 is a front view of showing a leg-common module according to the eighth embodiment.

As shown in FIG. 25, the leg common module 500 is configured such that the high potential terminal 55H connected to the upper arm semiconductor device 2H, the low potential terminal 55L connected to the lower arm semiconductor device 2L, and the output terminal 553 connected to the upper arm semiconductor device 2H and the lower arm semiconductor device 2L are protruded from the module body 550.

The following two wiring paths 501 and 502 in the module body 550 will be described. Specifically, the first wiring path 501 is defined as a path that connects the high potential terminal 55H and the low potential terminal 55L, passing through the last off elements 22 and the reflux element 21 which belong to mutually opposite arm. The second wiring path 502 is defined as a path that connects the high potential terminal 55H and the low potential terminal 55L, passing through the non-last off elements 23 and the reflux element 21 which belong to mutually opposite arm. In this respect, the total inductance of the first wiring path 501 is set to be smaller than the total inductance of the second wiring path 502.

As shown in FIG. 23, when focusing on the switching operation of the upper arm semiconductor device 2H, the inductance of the first wiring path 501 can be expressed by L15+L16+L17. The second wiring path 502 can be expressed by L25+L26+L17. That is, L15+L16+L17 < L25+L26+L17. Specifically, according to the present embodiment, L15<L25, L16<L26.

L15 is defined as inductance of a wiring between the high potential terminal 55H and the last off element 22 of the upper arm semiconductor 2H. L16 is defined as inductance of a wiring from the last off element 22 of the upper arm semiconductor device 2H to the reflux element 21 of the lower arm semiconductor 2L via the electrode plates 555 and 556 having the same potential as that of the output terminal 553. L17 is defined as inductance of a wiring between the reflux element 21 of the lower arm semiconductor device 2L and the low potential terminal 55L. L25 is defined as inductance of a wiring between the high potential terminal 55H and the last off element 22 of the upper arm semiconductor device 2H. L26 is defined as inductance of a wiring from the non-last off element 23 of the upper arm semiconductor device 2H to the reflux element 21 of the lower arm semiconductor device 2L via the electrode plates 555 and 556 having the same potential as that of the output terminal 553.

Figure 24:
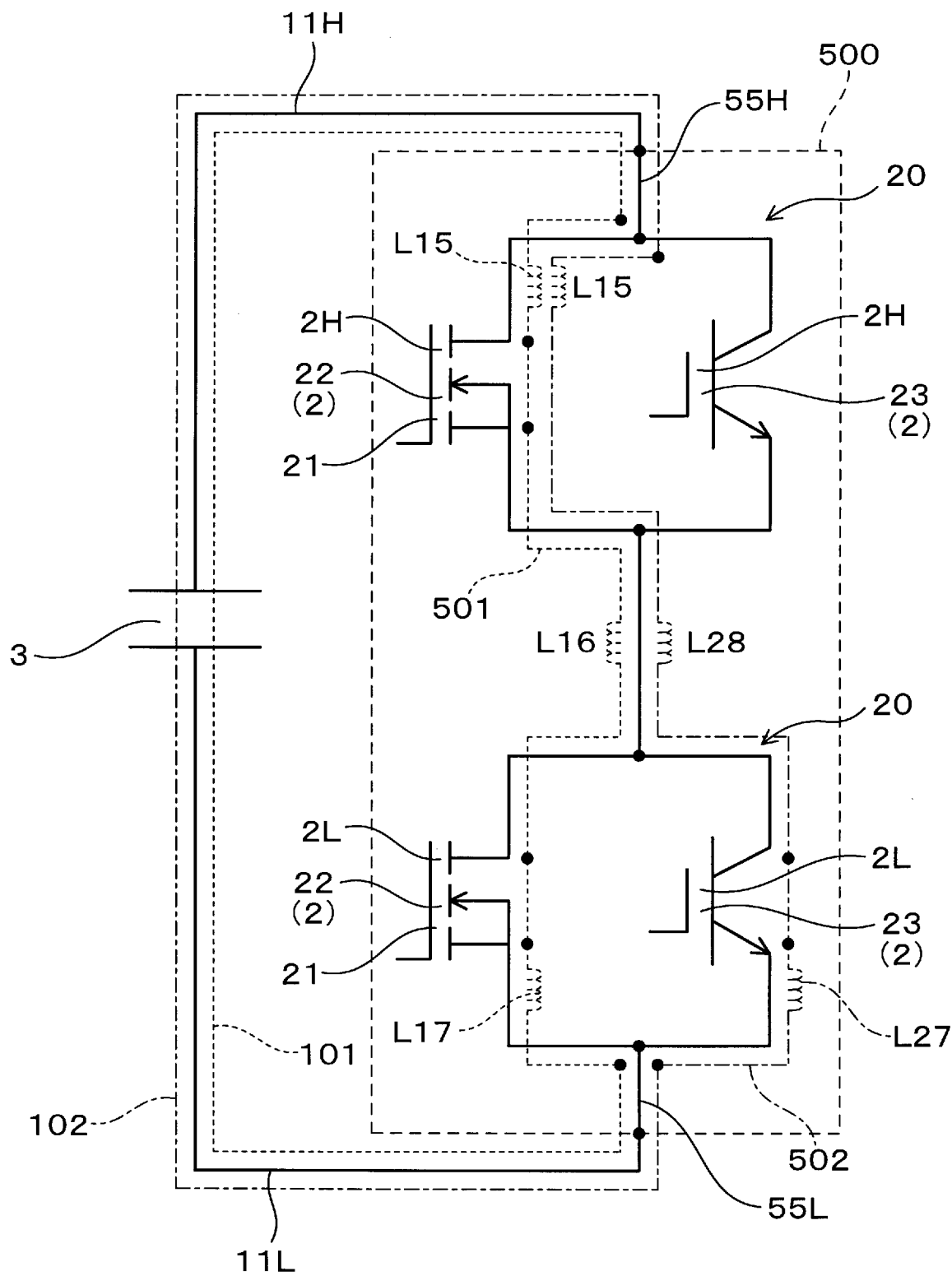
FIG. 24 is an explanatory diagram showing a last off closed circuit and a non-last off closed circuit when considering switching operation of a lower arm semiconductor device according to the eighth embodiment.

Next, a case will be described with reference to FIG. 24 in which the switching operation of the lower arm semiconductor device 2L is focused. In this case, the inductance of the first wiring path 501 can be expressed as L15+L16+L17. The inductance of the second wiring path 502 can be expressed as L15+L28+L27. That is, L15+L16+L17<L15+L28+L27 is satisfied. In particular, according to the present embodiment, L16<L28 and L16<L26 are satisfied.

Note that L15 is inductance of a wiring between the high potential terminal 55H and the reflux element 21 of the upper arm semiconductor device 2H. L16 is defined as inductance from the reflux element 21 of the upper arm semiconductor device 2H to the last off element 22 of the lower arm semiconductor device 2L via the electrode plates 555 and 556 having the same potential as that of the output terminal 553. L17 is defined as inductance of a wiring between the last off element 22 of the lower arm semiconductor device 2L and the lower potential terminal 55L. L27 is defined as inductance of wiring between the non-last off element 23 of the lower arm semiconductor device 2L and the lower potential terminal 552. L28 is defined as inductance of wiring from the reflux element 21 of the upper arm semiconductor device 2H to the non-last off element 23 of the lower arm semiconductor device 2L via the electrode plates 555 and 556 having the same potential as that of the output terminal 553. Note that L15, L16, L17 are similar between the case when focusing on the switching operation of the lower arm semiconductor device 2L and the case when focusing on the switching operation of the upper arm semiconductor device 2H so that the same reference numbers are applied.

As described, in the module body 550 of the leg common module 500, the inductance of the current path passing through the last off element 22 and the reflux element 21, and the inductance of the current path passing through the non-last off element 23 and the reflux element 21 are set to be different.

Figure 26:
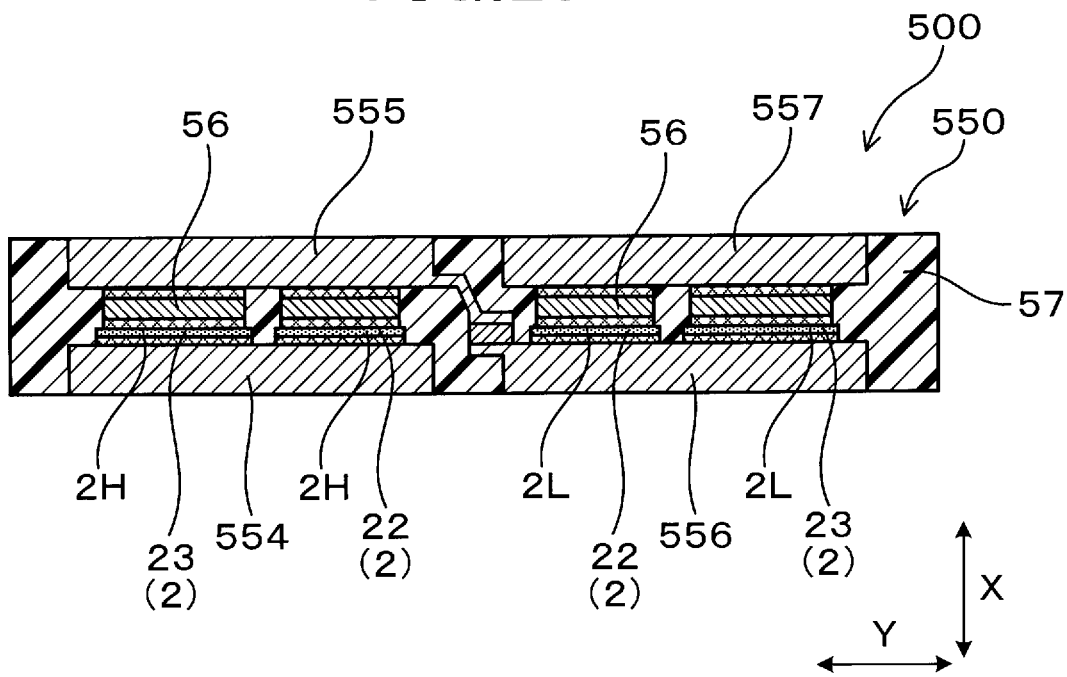
FIG. 26 is a cross-sectional view taken along a line XXVI-XXVI of FIG. 25.

As shown in FIGS. 25 and 26, the leg common module 500 includes four switching elements 2 which constitute two pairs of parallel-connected bodies 20. In other words, the module body 550 of the leg common module 500 includes two pairs of parallel-connected bodies 20 each including the last off element 22 and the non-last off element 23. The last off element 22 and the non-last off element 23 that constitute the parallel-connected body 20 of the upper arm semiconductor device 2H are connected in parallel by using the electrode plates 554 and 555. The last off element 22 and the non-last off element 23 that constitute the parallel-connected body 20 of the lower arm semiconductor device 2L are connected in parallel by using the electrodes 556 and 557.

The leg common module 500 includes two last off elements 22 and two non-last off elements 23 arranged along a single direction. Specifically, the two last off elements 22 and the two non-last off elements 23 are arranged in a single row in the width direction Y. The two last off elements 22 are disposed between the non-last off element 23. Since the reflux element 21 is configured of a part of the MOSFET together with the last off element 22, the reflux elements 21 are also present between the two non-last off elements 23.

Similar to the common modules 520 and 530 shown in seventh embodiment, as shown in FIG. 25, in the leg common module 500, the high potential terminal 55H, the low potential terminal 55L and the output terminal 553 are protruded from the module body 550 towards the same direction in the height direction Z. However, the high potential terminal 55H, the low potential terminal 55L are located closer to the center of the module body 550 in the width direction Y than the output terminal 553 is. Specifically, the high potential terminal 55H and the low potential terminal 55L are located closer to the center of the module body 550 in the width direction Y than the two non-last off elements 23. When viewed from the thickness direction X, the high potential terminal 55H is located in a position overlapping the last off element 22 of the upper arm semiconductor device 2H in the height direction Z, and the low potential terminal 55L is located in a position overlapping the last off element 22 of the lower arm semiconductor device 2L in the height direction Z.

With this arrangement, a current path through the high potential terminal 55H, the last off element 22 of the upper arm semiconductor device 2H, the reflux element 21 included in the last off element 22 of the lower arm semiconductor device 2L and the low potential terminal 55L can be shortened effectively. Hence, the inductance of this current path can be shortened. This current path is defined as the above-described first wiring path 501. Accordingly, the inductance of the last off closed circuit 101 is likely to be reduced.

Similarly, a current path through the high potential terminal 55H, the reflux element 21 included in the last off element 22 of the upper arm semiconductor device 2H, the last off element 22 of the lower arm semiconductor device 2L and the low potential terminal 55L can be shortened effectively. Other configurations are similar to those of the first embodiment.

According to the present embodiment, since the semiconductor elements included in the two parallel-connected bodies 20 which constitutes one leg is mounted on the leg common module 500 as a single semiconductor module, the power conversion apparatus 1 can be smaller. Also, the last off element 22 and the reflux element 21 in the opposite arm are mounted to one leg common module 500, whereby the inductance of the last off closed circuit 101 can be effectively small.

Further, inductance of the current path that constitutes a part of the last off closed circuit 101 is reduced in the common module 500. Hence, when assembling the power conversion apparatus 1, the inductance of the last off closed circuit 101 can readily be reduced. Also, two last off elements 22 are disposed between two non-last off elements 23. With this arrangement, as described above, inductance of the last off closed circuit 101 can be effectively reduced. Besides, similar operational effects to the first embodiment can be obtained.

Ninth Embodiment

As shown in FIGS. 27 to 30, according to the ninth embodiment, one parallel-connected body 20 is mounted to one common semiconductor module, that is, an upper arm common module 50H and a lower arm common module 50L.

Figure 27:
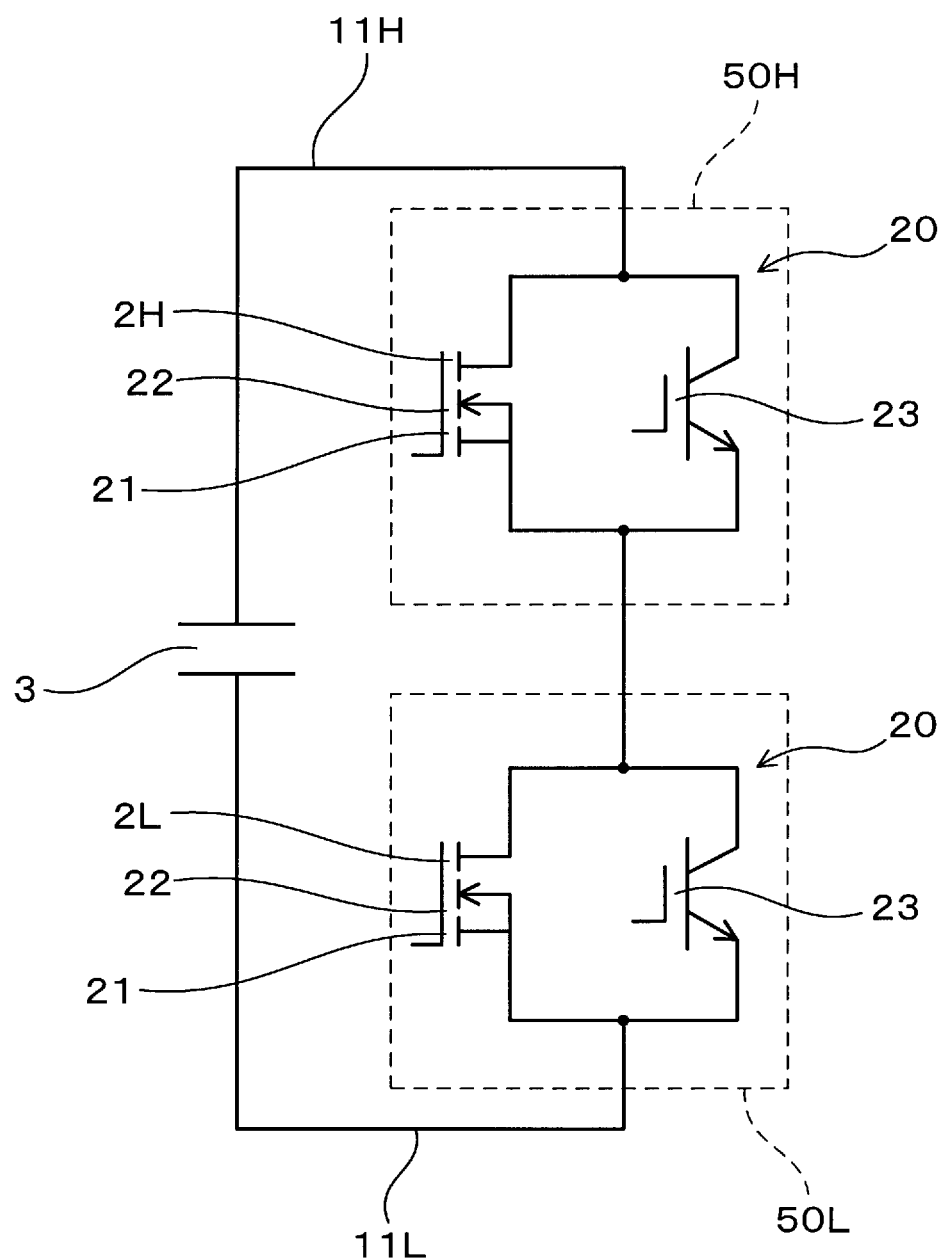
FIG. 27 is a circuit diagram showing a part of a power conversion apparatus according to a ninth embodiment.

As shown in FIG. 27, the parallel-connected body 20 of the upper arm semiconductor device 2H includes the last off element 22, the non-last off element 23 and the reflux element 21. The parallel-connected body 20 of the lower arm semiconductor device 2L includes the last off element 22, the non-last off element 23 and the reflux element 21. The last off element 22, the non-last off element 23 and the reflux element 21 of the upper arm semiconductor device 2L are mounted to the upper arm common module 50H as a single common semiconductor module. The last off element 22, the non-last off element 23 and the reflux element 21 of the lower arm semiconductor device 2L are mounted to the lower arm common module 50L as a single common semiconductor module.

Figure 28:
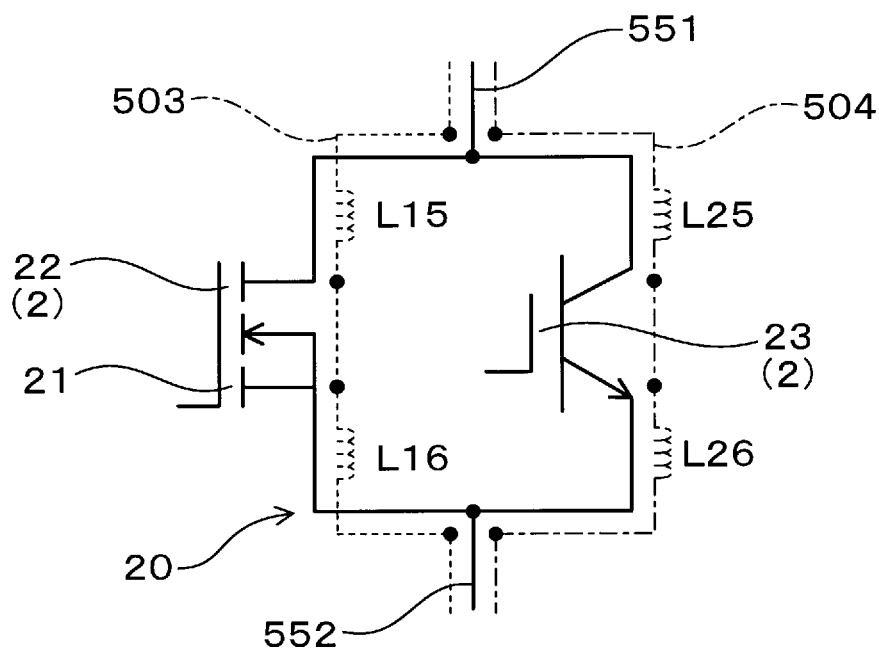
FIG. 28 is a circuit diagram showing a first wiring path and a second wiring path in the module body according to the ninth embodiment.
Figure 29:
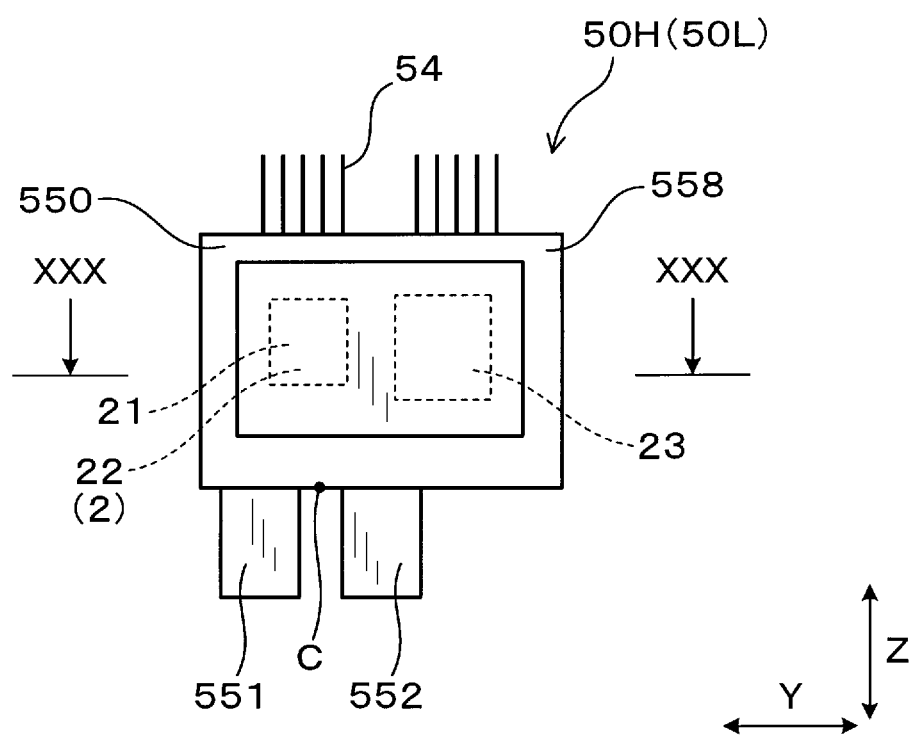
FIG. 29 is a front view showing an upper arm common module according to the ninth embodiment.

As shown in FIG. 29, each of the upper arm common module 50H and the lower arm common module 50L is configured such that two power terminals 551 and 552 are protruded from the module body 550. In the module body 550, as shown in FIG. 28, the following wiring paths 503 and 504 are considered. The first wiring path 593 connects two power terminals 551 and 552 via the last off element 22. The second wiring path 504 connects the two power terminals 551 and 552 via the non-last off element 23. Note that the total inductance of the first wiring path 503 is set to be smaller than the total inductance of the second wiring path 504.

As shown in FIG. 28, the inductance of the first wiring path 503 can be expressed as L15+L16, and the inductance of the second wiring path 504 can be expressed as L25+L26. In other words, L15+L16<L25+L26 is satisfied. L15 is defined as inductance of a wiring between the power terminal 551 in the high potential side and the last off element 22. L16 is defined as inductance of a wiring between the power terminal 551 in the low potential side and the last off element 22. L25 is defined as inductance of a wiring between the power terminal 551 in the high potential side and the last-off element 23. L26 is defined as inductance between the power terminal 552 in the low potential side and the non-last off element 23.

Specifically, for the upper arm common module 50H and the lower arm common module 50L, in the respective module bodies 550, the inductance of the current path through the last off element 22 and the inductance of the current path through the non-last off element 23 are set to be different from each other.

Figure 30:
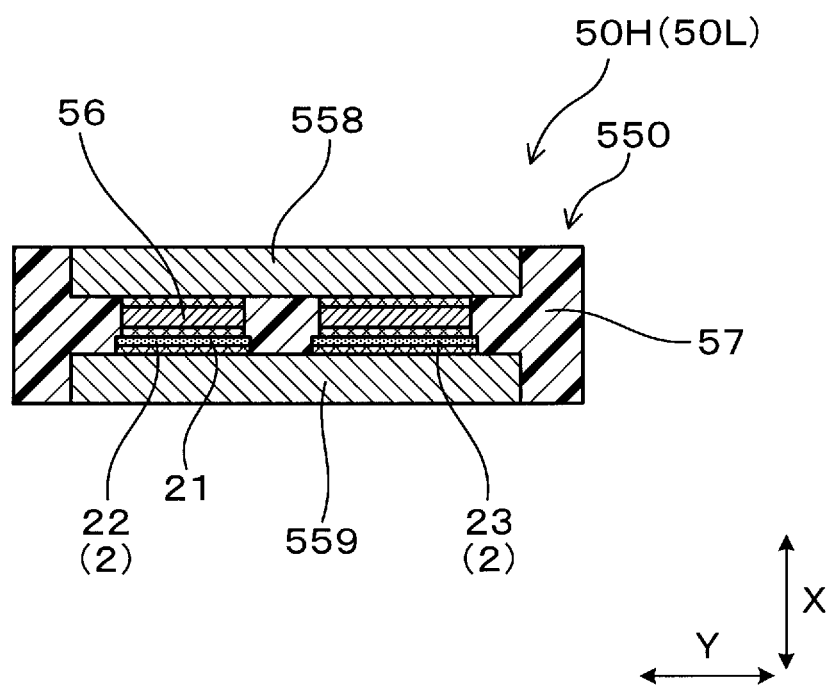
FIG. 30 is a cross-sectional view taken along a line XXX-XXX of FIG. 29.

The upper arm common module 50H and the lower arm common module 50L have the same structure. Hence, the upper common module 50H is used for explaining the structure thereof. As shown in FIGS. 29 and 30, the upper arm common module 50H is provided with two switching elements that constitute the parallel-connected body 20. Specifically, the two switching elements 2 are connected in parallel by two electrode plates 558 and 559. In other words, the last off element 22 and the non-last off element 23 are supported by the two electrode plates 558 and 559 in the thickness direction X. The last off element 22 and the non-last off element 23 are arranged in the width direction Y.

As shown in FIG. 29, according to the upper arm common module 50H, two power terminals 551 and 552 are protruded from the module body 550 in the same direction. The center position C in the root portion of the power terminals 551 and 552 is located closer to the last off element 22 than to the non-last off element 23 in a direction where the last off element 22 and the non-last off element are arranged, i.e., width direction Y. The reflux element 21 is configured together with the last off element 22 in the MOSFET. Hence, the center position C in the root portion of the two power terminals 551 and 552 is located closer to the reflux element 21 than to the non-last off element 23.

With this arrangement, a wiring path that connects the two power terminals 551 and 552 via the last off element 22 can be shortened. As a result, the inductance in the current path can be reduced. This current path is also referred to as the above-described first wiring path 503. Accordingly, the inductance of the last off closed circuit 101 is likely to be reduced. Other configurations are the same as those of the first embodiment.

According to the present embodiment, a single parallel-connected body 20 is mounted to one common semiconductor module, that is, the upper arm common module 50H or the lower arm common module 50L. Therefore, size of the power conversion apparatus 1 can be small easily.

In the upper common module 50H or the lower arm common module 50L, the inductance of the current path which is a part of the last off closed circuit 101 is reduced. Accordingly, when assembling the power conversion apparatus 1, the inductance of the last off closed circuit 101 can be reduced easily. Besides, the same operational effects as that of the first embodiment can be obtained.

The present disclosure is not limited to the above-described embodiments. However, the present disclosure is applicable to various modifications without departing the spirit thereof. Specifically, according to the sixth and seventh embodiments, the inductance of the last off closed circuit 101 is set to be smaller than that of the non-last off closed circuit 102. Also, according to the eighth and ninth embodiments, configurations are employed in which the inductance of the last off closed circuit 101 is set to be smaller than that of the non-last off closed circuit 102 by the bus bars 61, 62 and 63. However, it is not limited to the above-mentioned techniques but other techniques can be utilized as long as the inductance of the last closed circuit 101 is set to be smaller than that of the non-last off closed circuit 102.

What is claimed is:

1. A power conversion apparatus comprising:
a high potential line and a low potential line;
an upper arm semiconductor device connected to the high potential line;
a lower arm semiconductor device serially connected to the upper arm semiconductor device and connected to the low potential line; and
a capacitor connected between the high potential line and the low potential line, wherein
at least one of the upper arm semiconductor device and the lower arm semiconductor device which are serially connected to each other constitutes a parallel-connected body configured of two or more switching elements connected in parallel;
a reflux element is provided at least in an opposite arm opposite to an arm configured of the parallel-connected body among the upper arm semiconductor device and the lower arm semiconductor device, the reflux element allowing current to flow towards a high-potential line side from a low potential line side;
the switching elements that constitute the parallel-connected body are controlled such that turn-off timings are to be different from each other;
a last off element that turns off last and a non-last off element as the other element are identified among the switching elements that constitute the parallel-connected body; and
a set inductance of a last off closed circuit where current passes through the last off element, the reflux element in the opposite arm opposite to the last off element and the capacitor is smaller than a set inductance of a non-last off closed circuit where current passes through the non-last off element connected in parallel to the last off element, the reflux element in the opposite arm opposite to the last off element and the capacitor.

2. The power conversion apparatus according to claim 1, wherein
the switching elements that constitute the parallel-connected body are controlled such that turn-on timings are different from each other;
the last off element is a switching element which is controlled to be turned on first among the switching elements that constitute the parallel-connected body.

3. The power conversion apparatus according to claim 1, wherein
the switching elements that constitute the parallel-connected body are configured of SiC-MOSFET and Si-IGBT.

4. The power conversion apparatus according to claim 3, wherein
the last off element is configured of SiC-MOSFET and the non-last off element is configured of Si-IGBT.

5. The power conversion apparatus according to claim 3, wherein
the last off element is configured of Si-IGBT and the non-last off element is configured of SiC-MOSFET.

6. The power conversion apparatus according to claim 1, wherein
the last off element, the non-last off element and the reflux element are mounted to a semiconductor module;
the last off element and the non-last off element are mounted on a last off module and a non-last off module respectively, the last off module and the non-last off module being configured as individual semiconductor modules which are independent to each other; and
the last off closed circuit and the non-last off closed circuit each includes the semiconductor module, the capacitor and a bus bar connected to the semiconductor module, total inductance of the bus bar included in the last off closed circuit is smaller than total inductance of the bus bar included in the non-last off closed circuit.

7. The power conversion apparatus according to claim 6, wherein
the upper arm semiconductor device and the lower arm semiconductor device are mounted to an upper arm module and a lower arm module respectively, the upper arm module and the lower arm module being configured of the individual semiconductor modules;
the upper arm module and the lower arm module are mutually connected by an intermediate bus bar, the upper arm module is connected to the capacitor by a high potential bus bar that constitutes the high potential line, and the lower arm module is connected to the capacitor by a low potential bus bar that constitutes the low potential line; and
total inductance of the high potential bus bar, the low potential bus bar and the intermediate bus bar which are included in the last off closed circuit is smaller than total inductance of the high potential bus bar, the low potential bus bar and the intermediate bus bar being included in the non-last off closed circuit.

8. The power conversion apparatus according to claim 6, wherein
the upper arm semiconductor and the lower arm semiconductor are mounted to a common module as the semiconductor module shared thereby, the common module is connected to the capacitor by the high potential bus bar that constitutes the high potential line, and the low potential bus bar that constitutes the low potential line; and
total inductance of the high potential bus bar and the low potential bus bar included in the last off closed circuit is smaller than total inductance of the high potential bus bar and the low potential bus bar included in the non-last off closed circuit.

9. The power conversion apparatus according to claim 7, wherein
the last off module is located closer to the capacitor than the non-last off module is, the non-last off module being connected in parallel to the last off module.

10. The power conversion apparatus according to claim 1, wherein
the parallel-connected body of the upper arm semiconductor device includes the last off element, the non-last off element and a reflux permissible diode as the reflux element, and the parallel-connected body of the lower arm semiconductor device includes the last off element, the non-last off element and the reflux permissible diode as the reflux element;
the last off element, the non-last off element and the reflux element in the upper arm semiconductor device, and the last off element, the non-last off element and the reflux element in the lower arm semiconductor device are mounted to a leg common module as a single common semiconductor module;
the leg common module is configured such that a high potential terminal connected to the upper arm semiconductor device, a low potential terminal connected to the lower arm semiconductor device and an output terminal connected to the upper arm semiconductor device and the lower arm semiconductor device are protruded from a module body;
total inductance of a wiring path in the module body which connects the high potential terminal and the low potential terminal, passing through the last off element and the reflux element which belong to mutually opposite arm is smaller than total inductance of a wiring path in the module body which connects the high potential terminal and the low potential terminal passing through the non-last off element and the reflux element which belong to a mutually opposite arm.

11. The power conversion apparatus according to claim 10, wherein
the leg common module includes two last off elements and two non-last off elements arranged along a single direction, and the two last off elements are arranged between the two non-last off elements.

12. The power conversion apparatus according to claim 1, wherein
the parallel-connected body of the upper arm semiconductor device includes the last off element, the non-last off element and the reflux element, and the parallel-connected body of the lower arm semiconductor device includes the last off element, the non-last off element and the reflux element;
the last off element, the non-last off element and the reflux element in the upper arm semiconductor device are mounted to an upper arm common module as a single common semiconductor device, and the last off element, the non-last off element and the reflux element in the lower arm semiconductor device are mounted to a lower arm common module as a single common semiconductor device;

each of the upper arm common module and the lower arm common module is configured such that two power terminals are protruded from the module body; and inductance of a wiring path in the module body which connects the power terminals via the last off element is smaller than inductance of a wiring path in the module body which connects the power terminals via the non-last off element.

13. The power conversion apparatus according to claim 12, wherein each of the upper common module and the lower common module is configured such that the two power terminals are protruded from the module body in the same direction; and a center position in a root portion of the two power terminals is located closer to the last off element than to the non-last off element in a direction where the last off element and the non-last off element are arranged.

* * * * *